United States Patent
Ueda

(10) Patent No.: US 10,520,839 B2
(45) Date of Patent: Dec. 31, 2019

(54) CONTROL METHOD OF MOVABLE BODY, EXPOSURE METHOD, DEVICE MANUFACTURING METHOD, MOVABLE BODY APPARATUS, AND EXPOSURE APPARATUS

(71) Applicant: NIKON CORPORATION, Tokyo (JP)

(72) Inventor: Akihiro Ueda, Sakai (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/440,157

(22) Filed: Jun. 13, 2019

(65) Prior Publication Data

US 2019/0294061 A1    Sep. 26, 2019

Related U.S. Application Data

(60) Continuation of application No. 16/019,662, filed on Jun. 27, 2018, now Pat. No. 10,365,568, which is a division of application No. 15/627,966, filed on Jun. 20, 2017, now Pat. No. 10,036,968, which is a continuation of application No. PCT/JP2015/085850, filed on Dec. 22, 2015.

(30) Foreign Application Priority Data

Dec. 24, 2014    (JP) ................... 2014-259758

(51) Int. Cl.
| | | |
|---|---|---|
| G03F 9/00 | (2006.01) | |
| H01L 21/68 | (2006.01) | |
| H01L 21/027 | (2006.01) | |
| G03F 7/20 | (2006.01) | |
| G03F 7/30 | (2006.01) | |

(52) U.S. Cl.
CPC ............. *G03F 9/7084* (2013.01); *G03F 7/20* (2013.01); *G03F 7/30* (2013.01); *G03F 7/70775* (2013.01); *G03F 9/7046* (2013.01); *H01L 21/027* (2013.01); *H01L 21/68* (2013.01)

(58) Field of Classification Search
CPC .......... G03F 7/20; G03F 7/30; G03F 7/70775; G03F 9/7046; G03F 9/7084; H01L 21/027; H01L 21/68
USPC ........................................................ 430/22
See application file for complete search history.

(56) References Cited

U.S. PATENT DOCUMENTS

| | | |
|---|---|---|
| 5,151,750 A | 9/1992 | Magome et al. |
| 5,448,332 A | 9/1995 | Sakakibara et al. |
| 5,528,027 A | 6/1996 | Mizutani |
| 5,646,413 A | 7/1997 | Nishi |
| 6,611,316 B2 | 8/2003 | Sewell |
| 6,778,257 B2 | 8/2004 | Bleeker et al. |
| 7,023,610 B2 | 4/2006 | Ohtsuki et al. |
| 8,004,650 B2 | 8/2011 | Hirukawa |
| 8,593,646 B2 | 11/2013 | Den Boef et al. |
| 9,606,442 B2 | 3/2017 | Mathijssen et al. |
| 9,778,025 B2 | 10/2017 | Mathijssen et al. |
| 2002/0041377 A1 | 4/2002 | Hagiwara et al. |
| 2003/0025890 A1 | 2/2003 | Nishinaga |
| 2010/0066992 A1 | 3/2010 | Ono |
| 2012/0212718 A1 | 8/2012 | Den Boef |

FOREIGN PATENT DOCUMENTS

| | | |
|---|---|---|
| JP | H07-142325 A | 6/1995 |
| JP | H07-248208 A | 9/1995 |
| WO | 2001/035168 A1 | 5/2001 |

OTHER PUBLICATIONS

Mar. 29, 2016 International Search Report issued in International Patent Application No. PCT/JP2015/085850.
Jun. 27, 2017 International Preliminary Report on Patentability issued in International Patent Application No. PCT/JP2015/085850.
Dec. 7, 2017 Notice of Allowance issued in U.S. Appl. No. 15/627,966.
Apr. 4, 2018 Notice of Allowance issued in U.S. Appl. No. 15/627,966.
Feb. 25, 2019 Extended Search Report issued in European Application No. 15873081.2.
Mar. 13, 2019 Office Action issued in Japanese Application No. 2018-095988.
March 14, 2019 Notice of Allowance issued in U.S. Appl. No. 16/019,662.

*Primary Examiner* — Christopher G Young
(74) *Attorney, Agent, or Firm* — Oliff PLC

(57) ABSTRACT

In a beam irradiation apparatus in which a movable body holds an object, a mark detection system detects a first mark on the movable body while moving the movable body in a first direction and changing an irradiation position of a measurement beam in the first direction, the mark detection system detects a second mark while moving the movable body in the first direction and changing the irradiation position of the measurement beam in the first direction, a controller controls a position of the movable body in a second direction intersecting he first direction during a time period between the detection of the first mark and the detection of the second mark, and the controller controls the movement of the movable body to adjust a positional relation between the object on the movable body and a processing beam, based on results of the detection of the first and second marks.

11 Claims, 16 Drawing Sheets

CONTROL METHOD OF MOVABLE BODY, EXPOSURE METHOD, DEVICE MANUFACTURING METHOD, MOVABLE BODY APPARATUS, AND EXPOSURE APPARATUS

CROSS-REFERENCE TO RELATED APPLICATIONS

This is a continuation of U.S. patent application Ser. No. 16/019,662 filed Jun. 27, 2018, which is a divisional of U.S. patent application Ser. No. 15/627,966 filed Jun. 20, 2017 (now U.S. Pat. No. 10,036,968), which in turn is a continuation of International Application No. PCT/JP2015/085850, with an international filing date of Dec. 22, 2015. The disclosure of each of the above-identified prior applications is hereby incorporated herein by reference in its entirety.

BACKGROUND OF THE INVENTION

Field of the Invention

The present invention relates to control methods of movable bodies, exposure methods, device manufacturing methods, movable body apparatuses, and exposure apparatuses, and more particularly to a control method of a movable body on which an object provided. with plurality of marks is placed, an exposure method including the control method of the movable body, a device manufacturing method using the exposure method, a movable body apparatus including a movable body on which an object provided with a plurality of marks is placed, and an exposure apparatus equipped with the movable body apparatus.

Description of the Background Art

Conventionally, in a lithography process for manufacturing electronic devices (micro devices) such as semiconductor devices (integrated circuits and the like), and liquid crystal display devices, a projection exposure apparatus of a step-and-scan method (a so-called scanning stepper (which is also called a scanner)) and the like are used.

In this type of exposure apparatuses, for example, since plural layers of patterns are formed and overlaid on a wafer or a glass plate (hereinafter, generically referred to as a "wafer"), an operation (a so-called alignment) for optimizing a relative positional relationship between a pattern already formed on the wafer and a pattern that a mask or a reticle (hereinafter, generically referred to as a "reticle") has is performed. Further as an alignment sensor used in this type of alignment, the one that is capable of promptly performing detection of a grating mark provided on the wafer by scanning a measurement beam with respect to the grating mark (causing the measurement beam to follow the movement of wafer W) is known (e.g., refer to U.S. Pat. No. 8,593,646)

Here, also in order to improve the overlay accuracy, it is desirable to perform position measurement of the grating mark a plurality of times, and specifically, it is desirable to accurately and speedily perform the position measurement of grating marks in all of shot areas set on the wafer.

SUMMARY OF THE INVENTION

According to a first aspect, there is provided a control method of a movable body, comprising: detecting a first mark of a plurality of marks provided at an object placed on a movable body while scanning a measurement beam in a direction of a first axis with respect to the first mark, as moving the movable body in the direction of the first axis, the measurement beam being irradiated from a mark detection system; measuring a positional relationship between the first mark and the measurement beam; and adjusting a relative position between the measurement beam and the movable body in a direction of a second axis, on the basis of the positional relationship that has been measured, the second axis intersecting the first axis.

According to a second aspect, there is provided an exposure method, comprising: controlling the movable body on which an object provided with a plurality of marks is placed, with the control method of the movable body related to the first aspect; and forming a predetermined pattern on the object by irradiating the object with an energy beam, as controlling a position of the movable body within a two-dimensional plane that includes the first axis and the second axis on the basis of a detection result of the plurality of marks.

According to a third aspect, there is provided a device manufacturing method, comprising: exposing a substrate using the exposure method related to the second aspect; and developing the substrate that has been exposed.

According to a fourth aspect, there is provided a movable body apparatus, comprising: a movable body that is movable within a two-dimensional plane including a first axis and a second axis intersecting the first axis; a mark detection system that scans a measurement beam in a direction of the first axis, with respect to a plurality of marks provided at an object placed on the movable body; and a control system that performs detection of the marks using the mark detection system, as moving the movable body in the direction of the first axis, wherein the control system detects a first mark of the plurality of marks, and also measures a positional relationship between the first mark and the measurement beam and adjusts a relative position between the measurement beam and the movable body in a direction of a second axis, on the basis of the positional relationship that has been measured.

According to a fifth aspect, there is provided an exposure apparatus, comprising: the movable body apparatus related to the fourth aspect, in which an object provided with a plurality of marks is placed on the movable body; and a pattern forming apparatus that forms a predetermined pattern on the object by irradiating the object placed on the movable body with an energy beam, a position of the movable body within the two-dimensional plane being controlled on the basis of a detection result of the plurality of marks.

BRIEF DESCRIPTION OF DRAWINGS

In the accompanying drawings.

DESCRIPTION OF EMBODIMENTS

[First Embodiment]

A first embodiment will be discussed below, on the basis of FIGS. 1 to 11.

Figure 1:
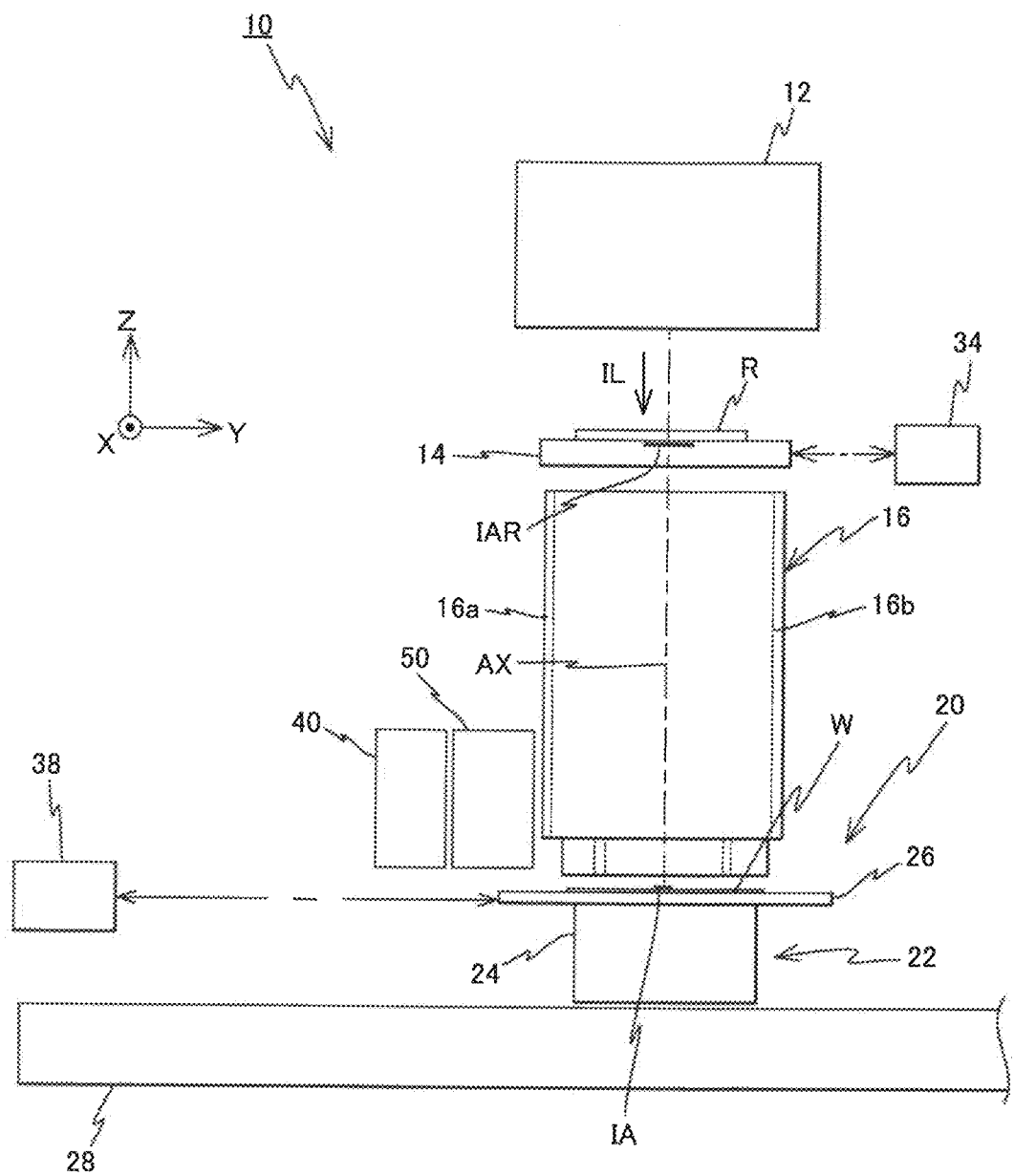
FIG. 1 is a view schematically showing a configuration of an exposure apparatus related a first embodiment.

FIG. 1 schematically shows a configuration of an exposure apparatus 10 related to the first embodiment. Exposure apparatus 10 is a projection exposure apparatus of a step-and-scan method, which is a so-called scanner. As will be described later, in the present embodiment, a projection optical system 16b is provided, and in the description below, the explanation is given assuming that a direction parallel to an optical axis AX of projection optical system 16b is a Z-axis direction, a direction in which a reticle R and a wafer W are relatively scanned within a plane orthogonal to the Z-axis direction is a Y-axis direction, a direction orthogonal to the Z-axis and the Y-axis is an X-axis direction, and rotation (tilt) directions around the X-axis, the Y-axis and the Z-axis are θx, θy and θz directions, respectively.

Exposure apparatus 10 is equipped with: an illumination system 12; a reticle stage 14; a projection unit 16; a wafer stage device 20 including a wafer stage 22; a multipoint focal position measurement system 40; an alignment system 50; a control system thereof; and the like. In FIG. 1, wafer W is placed on wafer stage 22.

As is disclosed in, for example, U.S. Patent Application Publication No. 2003/0025890 and the like, illumination system 12 includes: a light source; and an illumination optical system that has an illuminance uniformizing optical system having an optical integrator, and a reticle blind (none of which is illustrated). Illumination system 12 illuminates an illumination area IAR having a slit-like shape elongated in the X-axis direction on reticle R set (restricted) by the reticle blind (a masking system) with illumination light (exposure light) IL with almost uniform illuminance. As illumination light IL, for example, an ArF excimer laser beam (with a wavelength of 193 nm) is used.

On reticle stage 14, reticle R having a pattern surface (a lower surface in FIG. 1) on which a circuit pattern and the like are formed is fixed by, for example, vacuum adsorption. Reticle stage 14 is finely drivable within an XY plane and also drivable at a predetermined scanning velocity in a scanning direction (the Y-axis direction that is a lateral direction on the page surface of FIG. 1), with a reticle stage drive system 32 (not illustrated. in FIG. 1, see FIG. 6) including, for example, a linear motor and the like. Positional information within the XY plane (including rotation amount information in the θz direction) of reticle stage 14 is constantly measured at a resolution of, for example, around 0.5 to 1 nm with a reticle stage position measurement system 34 including, for example, an interferometer system (or an encoder system). The measurement values of reticle stage position measurement system 34 are sent to a main controller 30 (not illustrated in FIG. 1, see FIG. 6). Main controller 30 controls the position (and the velocity) of reticle stage 14 by calculating the position of reticle stage 14 in the X-axis direction, the Y-axis direction and the θz direction on the basis of the measurement values of reticle stage position measurement system 34 and controlling reticle stage drive system 32 on the basis of this calculation result. Further, exposure apparatus 10 is equipped with a reticle alignment system 18 (see FIG. 6) for performing detection of reticle alignment marks formed on reticle R, though the reticle alignment system is not illustrated in FIG. 1. As reticle alignment system 18, an alignment system having a configuration as disclosed in, for example, U.S. Pat. No. 5,646,413, U.S. Patent Application Publication No. 2002/0041377 and the like can be used.

Projection unit 16 is disposed below reticle stage 14 in FIG. 1. Projection unit 16 includes a lens barrel 16a and projection optical system 16b stored within lens barrel 16a. As projection optical system 16b, for example, a dioptric system composed of a plurality of optical elements (lens elements) arrayed along optical axis AX parallel to the Z-axis direction is used. Projection optical system 16b is, for example, both-side telecentric, and has a predetermined projection magnification (such as ¼times, ⅕times or ⅛times). Therefore, when illumination area IAR on reticle R is illuminated with illumination system 12, by illumination light IL, which. has passed through reticle R whose pattern surface is disposed almost coincident with a first plane (an object plane) of projection optical system 16b, a reduced image of a circuit pattern (a reduced image of a part of the circuit pattern) of reticle R within illumination area IAR is formed via projection optical system 16b (projection unit 16) onto an area (hereinafter, also referred to as an exposure area) IA, conjugate with illumination area IAR described above, on wafer W whose surface is coated with resist (sensitive agent) and which is disposed on a second plane (an image plane) side of projection optical system 16b. Then, by synchronous driving of reticle stage 14 and wafer stage 22, reticle R is moved in the scanning direction (the Y-axis direction) relative to illumination area IAR (illumination light IL) and also wafer W is moved in the scanning direction (the Y-axis direction) relative to exposure area IA (illumination light IL), and thereby scanning exposure of one shot area (a divided area) on wafer W is performed and the pattern of reticle R is transferred onto the shot area. That is, in the present embodiment, a pattern is generated on wafer W by illumination system 12, reticle R and projection optical system 16b, and the pattern is formed on wafer W by exposure of a sensitive layer (a resist layer) on wafer W with illumination light IL.

Wafer stage device 20 is equipped with wafer stage 22 disposed above a base board 28. Wafer stage 22 includes a stage main body 24, and a wafer table 26 mounted on stage main body 24. Stage main body 24 is supported on base board 28, via a clearance (an interspace, or a gap) of around several µm, by noncontact bearings (not illustrated), e.g., air bearings, fixed to the bottom surface of stage main body 24. Stage main body 24 is configured drivable relative to base board 28 in directions of three degrees of freedom (X, Y, θz) within a horizontal plane, by a wafer stage drive system 36 (not illustrated in FIG. 1, see FIG. 6) including, for example, a linear motor (or a planar motor). Wafer stage drive system 36 includes a fine drive system that finely drives wafer table 26 relative to stage main body 24 in directions of six degrees of freedom (X, Y, Z, θx, θy and θz). Positional information of wafer table 26 in the directions of six degrees of freedom is constantly measured at a resolution of, for example, around 0.5 to 1 nm with a wafer stage position measurement system 38 including, for example, an interferometer system (or an encoder system). The measurement values of wafer stage position measurement system 38 are sent to main controller 30 (not illustrated in FIG. 1, see FIG. 6). Main controller 30 controls the position (and the velocity) of wafer table 26 by calculating the position of wafer table 26 in the directions of six degrees of freedom on the basis of the measurement values of wafer stage position measurement system 38 and controlling wafer stage drive system 36 on the basis of this calculation result. Main controller 30 also controls the position of stage main body 24 within the XY plane on the basis of the measurement values of wafer stage position measurement system 38.

Figure 2A:
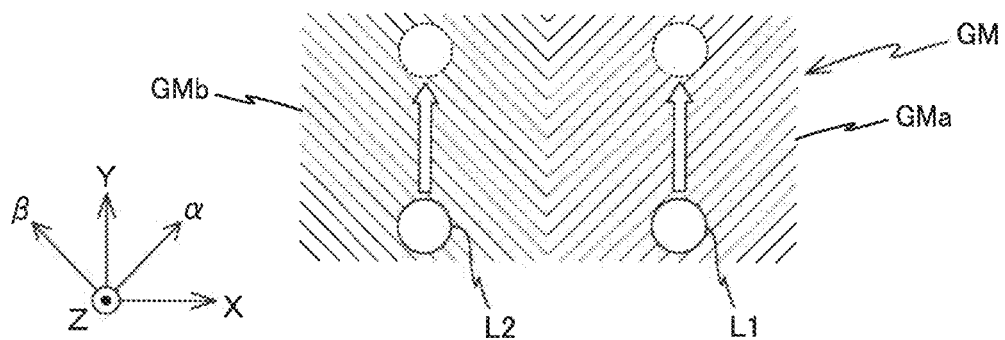
FIG. 2a to FIG. 2c are views showing examples (No. 1 to No. 3) of grating marks formed on a wafer.

Here, as a detection subject by alignment system 50, at least one grating mark GM as illustrated in FIG. 2a is formed in each shot area on wafer W. Note that actually grating mark GM is formed in a scribe line of each shot area.

Grating mark GM includes a first grating mark GMa and a second grating mark GMb. The first grating mark GMa is made up of a reflection-type diffraction grating in which grating lines extending in a direction (hereinafter, referred to as an α direction for the sake of convenience) that is at a 45 degree angle with respect to the X-axis within the XY plane are formed at a predetermined interval (a predetermined pitch) in a direction (hereinafter, referred to as a β direction for the sake of convenience) orthogonal to the α direction within the XY plane, and which has a period direction in the β direction. The second grating mark GMb is made up of a reflection-type diffraction grating in which grating lines extending in the β direction are formed at a predetermined interval (a predetermined pitch) in the α direction, and which has a period direction in the α direction. The first grating mark GMa and the second grating mark GMb are disposed consecutively (adjacently) in the X-axis direction so that the positions of the first grating mark GMa and the second grating mark GMb in the Y-axis direction are the same. Note that, in FIG. 2a, the pitch of the grating is illustrated considerably wider than the actual pitch for the sake of convenience for illustration. The same is true for diffraction gratings illustrated in the other drawings. Incidentally, the pitch of the first grating mark GMa and the pitch of the second grating mark GMb may be the same or may be different from each other. Further, although the first grating mark GMa and the second grating mark GMb are in contact with each other in FIG. 2, they need not be in contact with each other.

Referring back to FIG. 1, multipoint focal position measurement system 40 is a position measurement device of an oblique incidence method that measures positional information of wafer W in the Z-axis direction, which has a configuration similar to the one disclosed in, for example, U.S. Pat. No. 5,448,332 and the like. Multipoint focal position measurement system 40 is disposed on the further -Y side of alignment system 50 disposed on the -Y side of projection unit 16. Since the output of multipoint focal position measurement system 40 is used for autofocus control that will be described later, multipoint focal position measurement system 40 is referred to as an AF system 40 hereinafter.

AF system 40 is equipped with: an irradiation system that irradiates the wafer W surface with a plurality of detection beams; and a beam receiving system that receives reflection beams, from the wafer W surface, of the plurality of detection beams (none of these systems is illustrated). A plurality of detection points of AF system 40 (irradiation points of the detection beams) are disposed at a predetermined interval along the X-axis direction on a surface to be detected, though the illustration of the detection points is omitted. In the present embodiment, for example, the detection points are disposed in a matrix shape having one row and M columns (M is a total number of the detection points) or 2 rows and N columns (N is a half of the total number of the detection points). The output of the beam receiving system is supplied to main controller 30 (see FIG. 6). Main controller 30 obtains positional information in the Z-axis direction of the wafer W surface (surface position information) at the plurality of detection points on the basis of the output of the beam receiving system. In the present embodiment, a detection area of the surface position information by AF system 40 (a disposed area of the plurality of detection points) is set in a band-shaped area extending in the X-axis direction, as illustrated by providing the same reference sign as AF system 40 in FIGS. 8a to 8c. Further, the length in the X-axis direction of the detection area by AF system 40 is set equal to at least the length in the X-axis direction of one shot area set on wafer W.

Prior to an exposure operation, main controller 30 moves wafer W relative to the detection area of AF system 40 in the Y-axis direction and/or the X-axis direction as needed, and acquires the surface position information of wafer W on the basis of the output of AF system 40 at that time. Main controller 30 performs the acquisition of the surface position information as described above for all the shot areas set on wafer W, and associates the results of the acquisition with the positional information of wafer table 26 to store them as focus mapping information.

Figure 3:
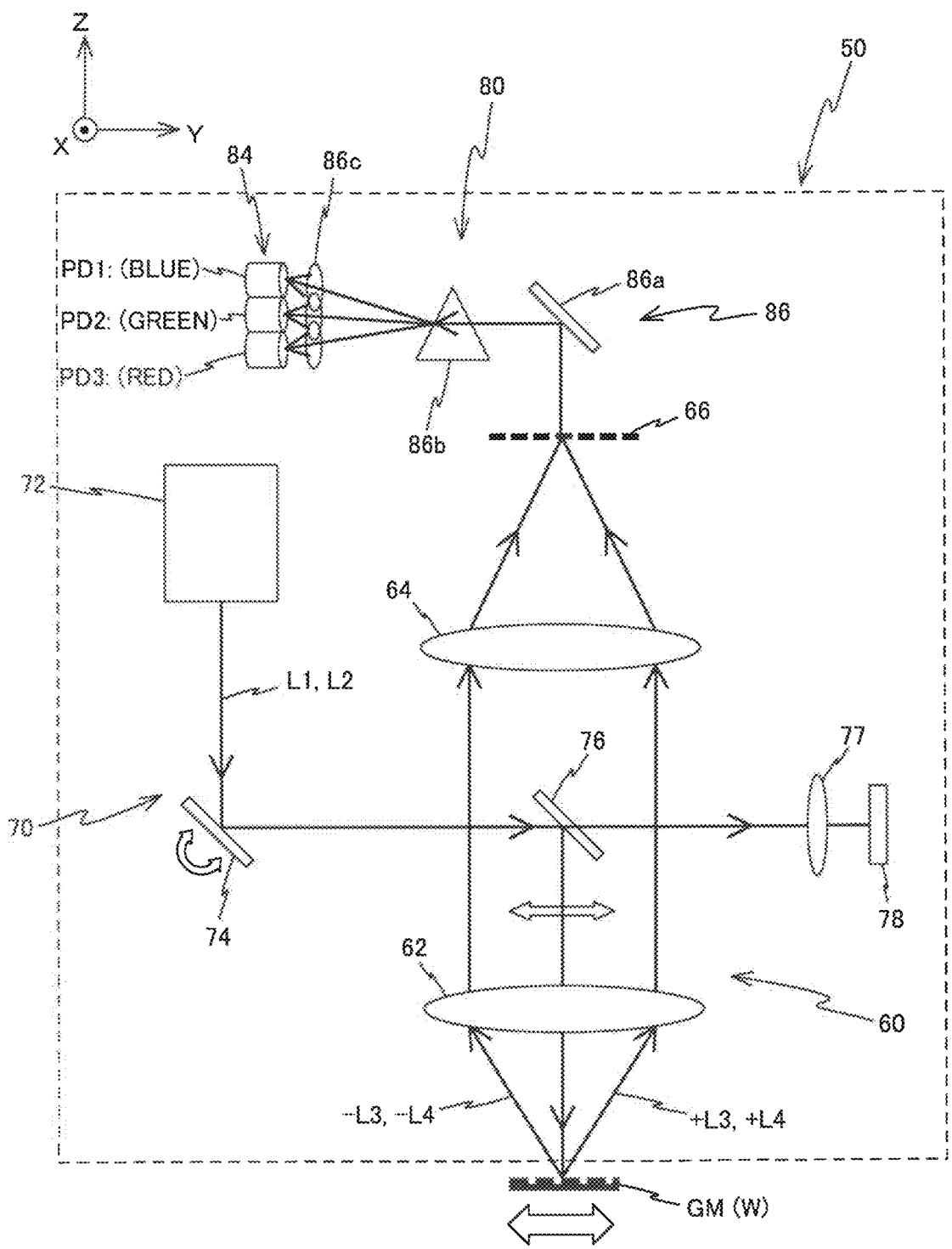
FIG. 3 is a view showing a configuration of an alignment system equipped in the exposure apparatus in FIG. 1.

As illustrated in FIG. 3, alignment system 50 is equipped with: an objective optical system 60 including an objective lens 62; an irradiation system 70; and a beam receiving system 80.

Irradiation system 70 is equipped with: a light source 72 that emits a plurality of measurement beams L1 and L2; a movable mirror 74 disposed on optical paths of measurement beams L1 and L2; a half mirror (a beam splitter) 76 that reflects parts of measurement beams L1 and L2 reflected by movable mirror 74 toward wafer W and transmits the rest of the measurement beams; a beam position detection sensor 78 disposed on optical paths of measurement beams L1 and L2 transmitted (having passed) through half mirror 76; and the like.

Light source 72 emits a pair of measurement beams L1 and L2 having a broadband wavelength, to which the resist coated on wafer W (see FIG. 1) is insensitive, in the −Z direction. Note that, in FIG. 3, the optical path of measurement beam L2 overlaps with the optical path of measurement beam L1, on the depth side of the paper surface. In the present first embodiment, as measurement beams L1 and L2, for example, white light is used.

As movable mirror 74, for example, the well-known galvano mirror is used in the present embodiment. Movable mirror 74 has a reflection surface for reflecting measurement beams L1 and L2 that is configured capable of moving rotationally (rotating) around an axis line parallel to the X-axis. The angle of rotational movement of movable mirror 74 is controlled by main controller 30 (not illustrated in FIG. 3, see FIG. 6). The angle control of movable mirror 74 will be further described later. Incidentally, an optical member (e.g., a prism or the like) other than the galvano mirror may be used, as far as such an optical member can control the reflection angle of measurement beams L1 and L2.

The position (the angle of a reflection surface) of half mirror 76 is fixed, which is different from movable mirror 74. The optical paths of the parts of measurements beams L1 and L2 reflected off the reflection surface of movable mirror 74 are bent to the −Z direction by half mirror 76, and then the parts of measurements beams L1 and L2 are transmitted (pass) through the center portion of objective lens 62 to be incident almost perpendicularly on grating mark GM formed on wafer W. Note that, in FIG. 3, movable mirror 74 is inclined at a 45 degree angle with respect to the Z-axis, and the parts of measurement beams L1 and L2 from movable mirror 74 are reflected off half mirror 76 in a direction parallel to the Z-axis. Further, although only movable mirror 74 and half mirror 76 are disposed on the optical paths of measurement beams L1 and L2 between light source 72 and objective lens 62 in FIG. 3, irradiation system 70 is configured so that measurement beams L1 and L2 emitted from objective lens 62 are almost perpendicularly incident on grating mark GM formed on wafer W even in the case where movable mirror 74 is inclined at an angle other than a 45 degree angle with respect to the Z-axis. In this case, on the optical paths of measurement beams L1 and L2 between light source 72 and objective lens 62, at least one optical member that is different from movable mirror 74 and half mirror 76 may be disposed. Measurement beams L1 and L2 having passed (transmitted) through half mirror 76 are incident on beam position detection sensor 78 via a lens 77. Beam position detection sensor 78 has a photoelectric conversion element such as a PD (Photo Detector) array or a CCD (Charge Coupled Device), and its imaging plane is disposed on a plane conjugate with the wafer W surface.

Here, as illustrated in FIG. 2a, the distance between measurement beams L1 and L2 is set so that, of measurement beams L1 and L2 emitted from light source 72, measurement beam L1 is irradiated on the first grating mark GMa and measurement beam L2 is irradiated on the second grating mark GMb. In alignment system 50, when the angle of the reflection surface of movable mirror 74 is changed, the respective incidence (irradiation) positions of measurement beams L1 and L2 on grating marks GMa and GMb (wafer W) are changed in the scanning direction (the Y-axis direction) in accordance with the angle of the reflection surface of movable mirror 74 (see outlined arrows in FIG. 2a). Further, in conjunction with the positional change on grating mark GM of measurement beams L1 and L2, the incidence positions of measurement beams L1 and L2 on beam position detection sensor 78 (see FIG. 3) are also changed. The output of beam position detection sensor 78 is supplied to main controller 30 (not illustrated in FIG. 2a, see FIG. 6). Main controller 30 can obtain irradiation position information of measurement beams L1 and L2 on wafer W on the basis of the output of beam position detection sensor 78.

Figure 8A:
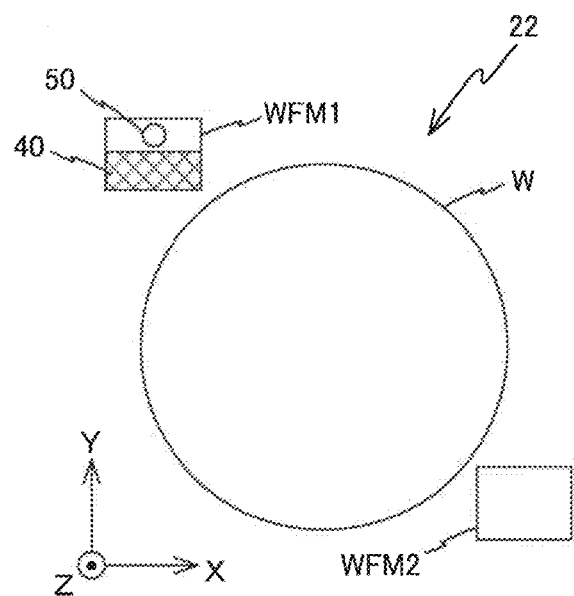
FIGS. 8a to 8c are views (No. 1 to No. 3) used to explain an alignment measurement operation and a focus mapping operation.
Figure 8B:
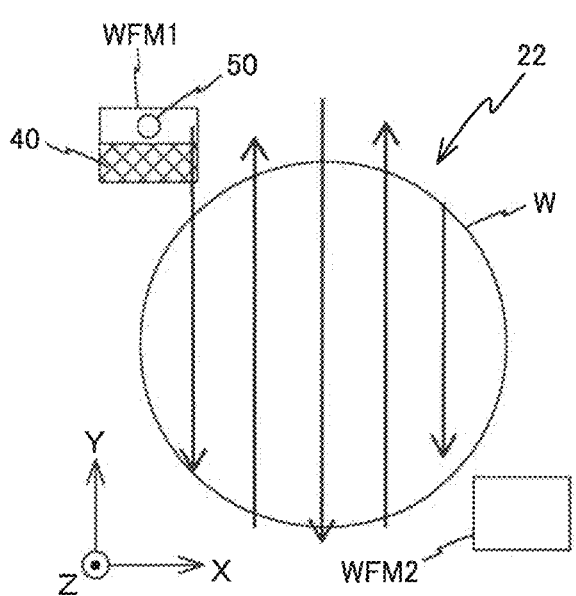
Figure 8C:
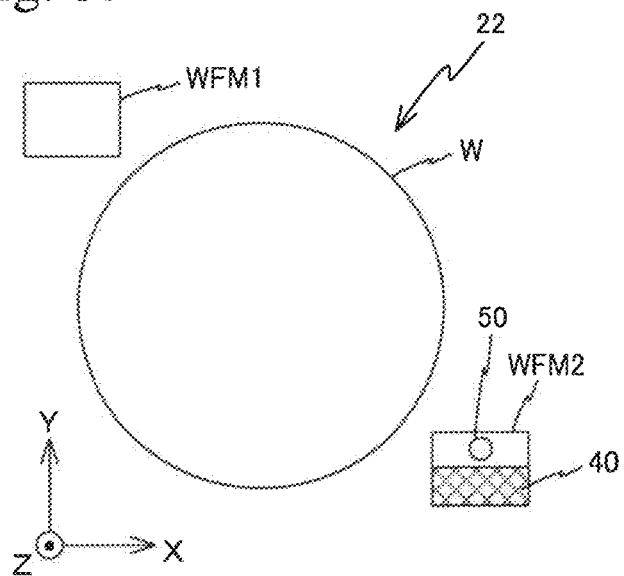

Here, as illustrated in FIG. 1, since alignment system 50 is disposed on the +Y side further than AF system 40 described above, the detection area (the detection point) of alignment system 50 is disposed on the +Y side with respect to the detection area of AF system 40, as illustrated by providing the same reference sign as alignment system 50 in FIGS. 8a to 8c. However, the disposed positions are not limited thereto, and these detection areas may overlap with each other in the Y-axis direction.

Objective optical system 60 is equipped with objective lens 62, a detector-side lens 64, and a grating plate 66. In alignment system 50, when measurement beam L1 irradiated on the first grating mark GMa (see FIG. 2a) in a state where grating mark GM is located directly under objective optical system 60, a plurality (according to beams with a plurality of wavelengths included in white light) of ±first-order diffraction beams ±L3, based on measurement beam L1, generated from the first grating mark GMa are incident on objective lens 62. Similarly, when measurement beam L2 is irradiated on the second grating mark GMb (see FIG. 2a), a plurality of ±first-order diffraction beams ±L4, based on measurement beam L2, generated from the second grating mark GMb are incident on objective lens 62. The respective optical paths of the ±first-order diffraction beams ±L3 and ±L4 are bent by objective lens 62. Detector-side lens 64 condense each of the ±first-order diffraction beams ±L3 and ±L4 on grating plate 66 disposed above the foregoing detector-side lens 64.

Figure 4:
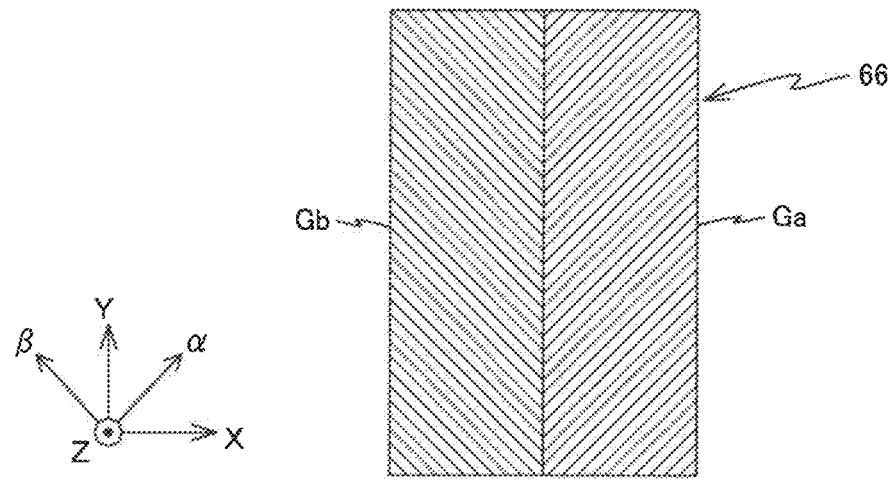
FIG. 4 is a plan view of readout diffraction gratings equipped in the alignment system in FIG. 3.

ON grating plate 66, as illustrated in FIG. 4, readout diffraction gratings Ga and Gb extending in the Y-axis direction are formed. Readout diffraction grating Ga is a transmission type diffraction grating that corresponds to grating mark GMa (see FIG. 2a) and has a period direction in the β direction. Readout diffraction grating Gb is a transmission type diffraction grating that corresponds to grating mark GMb (see FIG. 2a) and has a period direction in the αdirection. Note that, in the present embodiment, the pitch of readout diffraction grating Ga is set to be substantially the same as the pitch of grating mark GMa. Further, the pitch of readout diffraction grating Gb is set to be substantially the same as the pitch of grating mark GMb.

Beam receiving system 80 is equipped with: a detector 84; an optical system 86 that guides, to detector 84, light corresponding to images (interference fringes) formed on grating plate 66 (readout diffraction gratings Ga and Gb) by interference between the diffraction beams (±L3 and ±L4) based on measurement beams L1 and L2, as will be described later; and the like.

The light corresponding to the images (the interference fringes) formed on readout diffraction gratings Ga and Gb is guided to detector 84 via a mirror 86a that optical system 86 has. In alignment system 50 of the present embodiment, optical system 86 has a spectral prism 86b, which corresponds to white light being used as measurement beams L1 and L2. The light from grating plate 66 is spectrally split, for example, into respective colors of light, i.e., blue light, green light and red light, via spectral prism 86b. Detector 84 has photodetectors PD1 to PD3 that are independently provided corresponding to the respective colors described above. The output of each of photodetectors PD1 to PD3 that detector 84 has is supplied to main controller 30 (not illustrated in FIG. 3, see FIG. 6).

Figure 5A:
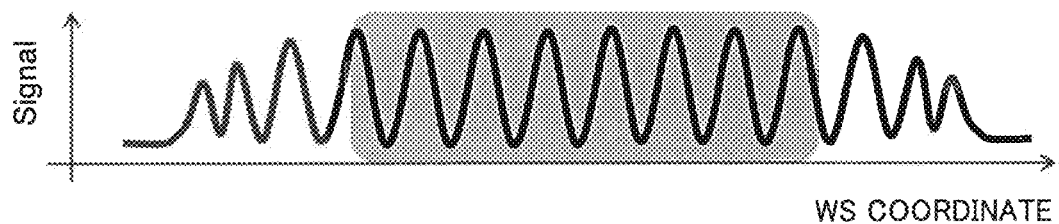
FIG. 5a is a view showing an example of a waveform generated on the basis of the output of a detection system equipped in the alignment system in FIG. 3.

From the output of each of photodetectors PD1 to PD3, a signal (an interference signal) having a waveform as illustrated in FIG. 5*a* is obtained, as an example. Main controller 30 (see FIG. 6) obtains the position of each of grating marks GMa and GMb, by calculation, from the phase of the signal described above. That is, in exposure apparatus 10 (see FIG. 1) of the present embodiment, alignment system 50 and main controller 30 (see FIG. 6 for each of them) configure an alignment, device for obtaining positional information of grating mark GM formed on wafer W.

When performing position measurement of grating mark GM using alignment system 50, main controller 30 (see FIG. 6) controls movable mirror 74 while driving grating mark GM (i.e., wafer W) relative to alignment system 50 as shown by a double-headed arrow in FIG. 3, and thereby causes measurement beams L1 and L2 to follow grating mark GM and scans measurement beams L1 and L2 in the Y-axis direction (see FIG. 2*a*). Accordingly, since grating mark GM and grating plate 66 are relatively moved in the Y-axis direction, interference fringes are imaged (formed) on readout diffraction gratings Ga and Gb which grating plate 66 has, respectively, by interference between the diffraction beams based on measurement beam L1 and interference between the diffraction beams based on measurement beam L2. The interference fringes imaged on grating plate 66 are detected by detector 84 as previously described. The output of detector 84 is supplied to main controller 30. Incidentally, the waveform as illustrated in FIG. 5*a* is generated on the basis or relative movement between grating marks GMa and GMb, and readout diffraction gratings Ga and Gb (see FIG. 4), and therefore is generated irrespective of the positions of measurement beams L1 and L2 irradiated on grating marks GMa and GMb. Consequently, the movement of grating marks GMa and GMb (i.e., wafer stage 22) and the scanning of measurement beams L1 and L2 do not necessarily have to be completely in synchronization (their velocities do not strictly have to be coincident).

Here, in the present embodiment, while grating mark GM is moved in the Y-axis direction, the irradiation points of the measurement beams are moved in the Y-axis direction so as to follow the grating mark GM, and therefore the absolute value of the position of grating mark GM on wafer W is obtained in the method described below. Incidentally, in the case where the positions within the XY plane of the irradiation points of the measurement beams irradiated from alignment system 50 are fixed as in the conventional case, the absolute value of the position of grating mark GM can be obtained on the basis of the center of the output (the waveform similar to the one as illustrated in FIG. 5*a*) of the alignment system.

Figure 5B:
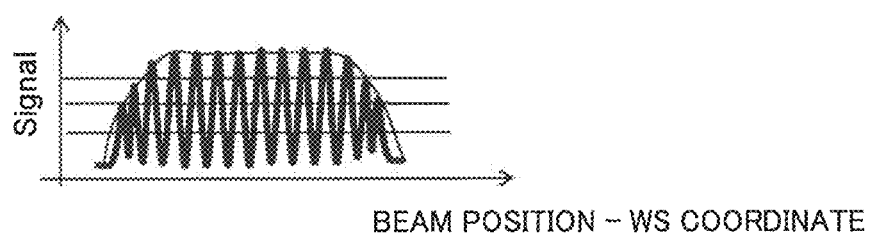
FIG. 5b is a view showing a waveform obtained by adjusting a lateral axis of the waveform in FIG. 5a, and FIG. 5c is a concept view of the way of obtaining the position of a grating mark on the wafer.

Separately from the waveform as illustrated in FIG. 5*a* (hereinafter, referred to as a first waveform), main controller 30 generates a waveform as illustrated in FIG. 5*b* (hereinafter, referred to as a second waveform). The signals indicated by the first waveform and the second waveform are those generated by convolution of the measurement beams, readout diffraction gratings Ga and Gb, and grating mark GM. Here, the horizontal axis of the first waveform shows the Y coordinate value of wafer table 26, while the horizontal axis of the second waveform shows the difference between the Y position of the measurement beams and the Y coordinate value of wafer table 26 that is obtained on the basis of the output of beam position detection sensor 78 of alignment system 50 and the output of wafer stage position measurement system 38. That is, the first waveform and the second waveform are both outputted when the measurement beams traverse one grating mark GM in the scanning direction, though the horizontal axes are set differently from each other. Of these waveforms, the first waveform is a waveform that shows a periodic signal obtained by the interference fringes imaged on readout diffraction gratings Ga and Gb by the interference between a predetermined-order diffraction beams, e.g., the ±first-order diffraction beams generated at grating mark GM, and shows that the entire measurement beams are located in grating mark GM (i.e., a part of the measurement beams does not positioned on an edge portion of grating mark GM), during a predetermined period of time in which the intensity is constant (the range shaded in FIG. 5*a*).

On the other hand, the second waveform is a waveform that shows the position related to grating mark GM to some extent and the shape thereof by subtracting the position of the wafer stage from the beam positions of the measurement beams. Specifically, an envelope of the second waveform shows the overlapping of the measurement beams and grating mark GM on the wafer, and the starting point to the end point of this envelope is to show the outline position and shape of grating mark GM. Note that a midpoint between the starting point and the end point of the envelope of the second waveform is to show the center of grating mark GM.

Main controller 30 obtains the approximate position (the rough position) of the grating mark from the center position of the second waveform by calculation. the approximate position can be obtained with the well-known method such as a slice method, for example, using the edge portion of the second waveform in which the signal intensity increases, as the calculation.

Next, main controller 30 obtains the mark position from the first waveform (phase) with, for example, the well-known method such as fast Fourier transformation. At this time, main controller 30 uses only data in which the measurement beams are completely within grating mark GM (data within the range shaded in FIG. 5*a*).

Figure 5C:
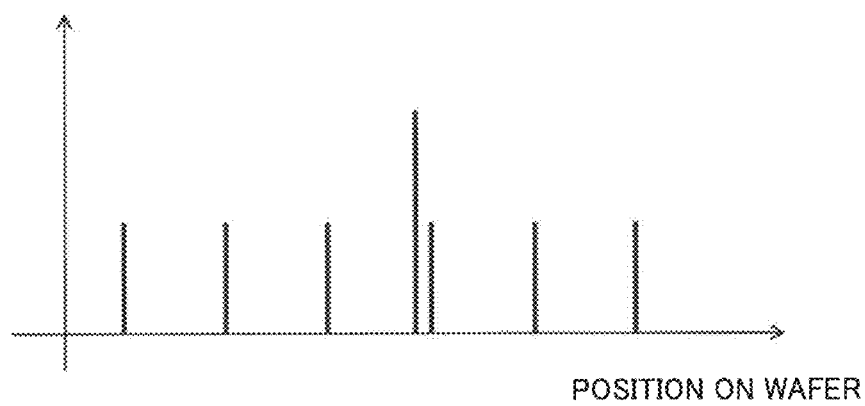
Figure 6:
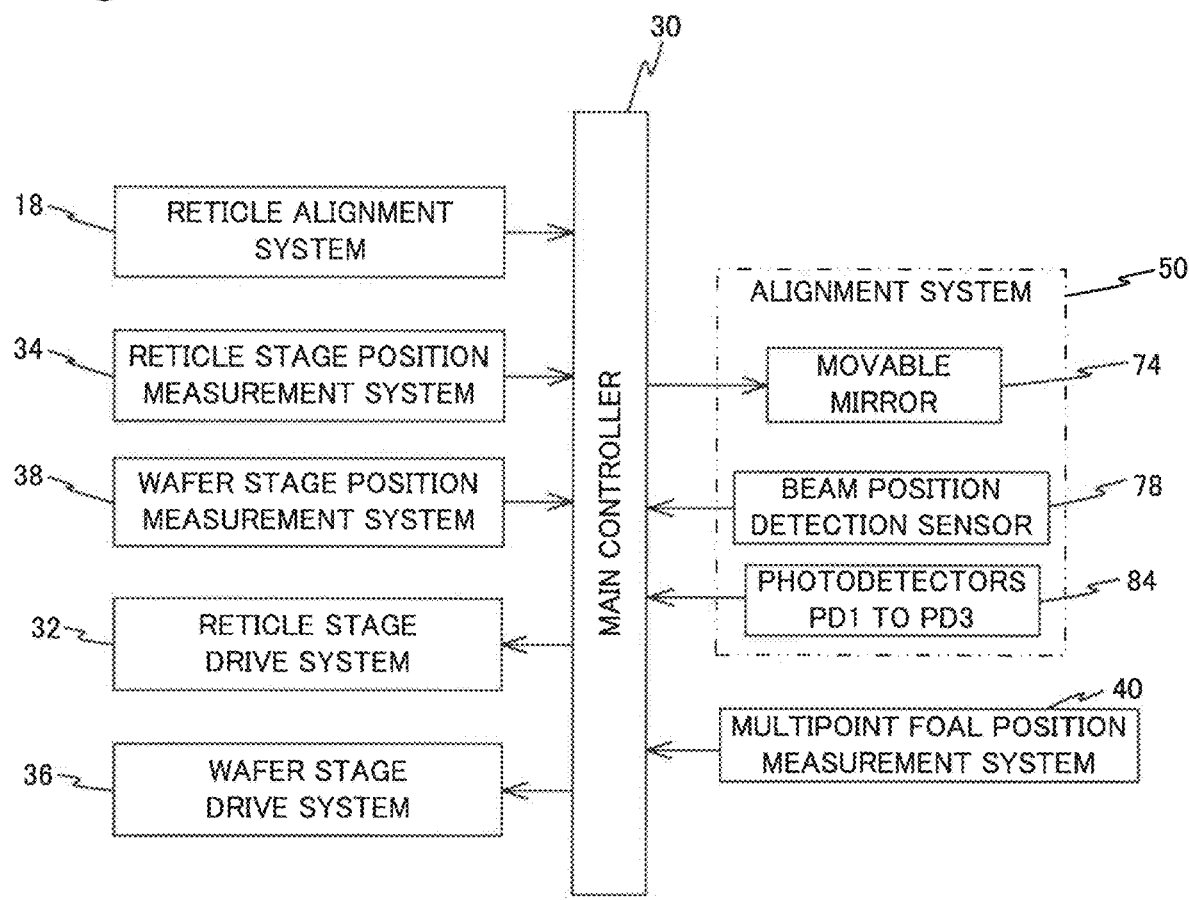
FIG. 6 is a block diagram showing a control system of the exposure apparatus.

FIG. 5*c* is a concept view of the calculation method of the absolute value of grating mark GM. In FIG. 5*c*, a plurality of lines that are short in a vertical axis direction (short lines) mean the position of grating mark GM that is supposed from the first waveform, and each of these plurality of short lines corresponds to the peak of the first waveform in FIG. 5*a*. Note that, although six short lines that are close to a long line, which will be described later, are representatively illustrated in FIG. 5*c*, actually the short lines more than six appear. Further, in FIG. 5*c*, one long line elongated in the vertical axis direction (a long line) means the rough position of grating mark GM (e.g., the position in the center of grating mark GM described above) obtained from the second waveform, and the short line (a candidate for the mark position) that is closest to this long line (the rough position of the grating mark) indicates the absolute value of grating mark GM on wafer W (the absolute position related to the center of grating mark GM).

Incidentally, since alignment system 50 scans the measurement beams in the Y-axis direct ion in the present embodiment, the absolute value of grating mark GM related to the Y-axis direction can be obtained with the method described above. However, in order to obtain the absolute value related to the X-axis direction, for example, it is preferable that wafer W (grating mark GM) and alignment system 50 are relatively moved in the X-axis direction (this is similarly applied to the second embodiment to he discussed later).

Specifically, by causing the measurement beams and grating mark GM to relatively meander (to move in directions intersecting the X-axis and the Y-axis (e.g., directions that is at a +45 degree angle and a −45 degree angle with respect to the X-axis and the Y-axis)), and scanning the measurement beams in the X-axis direction, the edge portion of grating mark GM is detected. Alternatively, it is preferable that the measurement beams and grating mark GM are relatively moved in the X-axis direction only once so that the edge portion of grating mark GM can be detected in the X-axis direction similarly to the Y-axis direction. Incidentally, an operation of detecting the edge portion of grating mark GM by causing the measurement beams and grating mark GM to relatively meander and scanning the measurement beams in the X-axis direction may he performed with respect to, for example, a grating mark GM ($1^{st}$ grating mark), as a target, that is formed in the first shot area to be described later and is measured first by alignment system 50. Alternatively, an operation of scanning the measurement beams in the X-axis direction only once and detecting the edge portion of grating mark GM may be performed with respect to, for example, a grating mark GM ($1^{st}$ grating mark), as a target, that is formed in the first shot area to be described later and is measured first by alignment system 50. Incidentally, the period directions of a pair of grating mark GMa and GMb may be slightly shifted without making the period directions orthogonal.

Next, an exposure operation using exposure apparatus 10 of FIG. 1 will be discussed using a flowchart illustrated in FIG. 7. The exposure operation described below is performed under the control of main controller 30 (see FIG. 6).

Main controller 30 loads wafer W subject to exposure onto wafer stage 22 (see FIG. 1 for each of them) in Step S10. At this time, wafer stage 22 is positioned at a predetermined loading position on base board 28 (see FIG. 1).

When the wafer loading is completed, main controller 30 performs a first-time calibration (calibrating) of AF system 40 and alignment system 50 in the next step, Step S12. In the present embodiment, as illustrated in FIG. 8a, the first-time calibration is performed using a first measurement mark (a fiducial mark) WFM1 that wafer stage 22 has. In wafer stage 22 of the present embodiment, wafer W is held by a wafer holder (not illustrated) disposed in the center of the upper surface of wafer table 26 (see FIG. 1), and the first measurement mark WFM1 is disposed at a position on the ±Y side and the −X side in an outside area of the wafer holder on the upper surface of wafer table 26. Further, at a position on the −Y side and the +X side in the outside area of the wafer holder on the upper surface of wafer table 26, a second measurement mark WFM2 is disposed that is used when a second-time calibration, which will be described later, is performed.

On each of the first measurement mark WFM1 and the second measurement mark WFM2, a reference surface for performing calibration of AF system 40 and a reference mark for performing calibration of alignment system 50 are formed (none of the reference surface and the reference mark is illustrated). The configurations of the first measurement mark WFM1 and the second measurement mark WFM2 are substantially the same except for their different disposed positions For a first-time calibration operation, main controller 30 drives wafer stage 22 to position the first measurement mark WFM1 so as to be located directly under AF system 40 and alignment system 50. Incidentally, the loading position described above may be set so that the first measurement mark WFM1 is located directly under AF system 40 and alignment system 50 in a state in which wafer stage 22 is located at the loading position described above.

In the calibration operation in the present step, Step S12, main controller 30 performs the calibration of AF system 40 using the reference surface on the first measurement mark WFM1, and also causes alignment system 50 to measure the reference mark on the first measurement mark WFM1. Then, main controller 30 obtains positional information of (the detection center of) alignment system 50 within the XY plane on the basis of the output of alignment system 50 and the output of wafer stage position measurement system 38. The reference mark for performing the calibration of alignment system 50 is substantially the same as grating mark GM (see FIG. 2a) formed on wafer W.

When the first-time calibration is completed, main controller 30 starts alignment measurement and surface position measurement in the next step, Step S14. Therefore, main controller 30 positions a first shot area so as to be located directly under AF system 40 and alignment system 50, by driving wafer stage 22. Here, the first shot area refers to a shot area to which the alignment measurement and the surface position measurement are performed first among all shot areas subject to detection, and in the present embodiment, refers to, for example, a shot area on the utmost +Y side among a plurality of shot areas arrayed on the utmost −X side.

Here, in the present embodiment, since the detection area of AF system 40 is disposed on the −Y side relative to the detection area of alignment system 50, the surface position information of a shot area is obtained before grating mark GM formed in the shot area. Then, main controller 30 controls the position and the attitude in the Z-axis direction (the tilt in the θx direction and the θz direction) of wafer table 26 on the basis of the surface position information described above and the offset value that has been obtained beforehand for each layer, and thereby causes objective optical system 60 of alignment system 50 to focus on grating mark GM subject to detection. In the present embodiment, the offset value described above refers to the measurement value of AF system 40 that is obtained when the position and the attitude of wafer table 26 are adjusted so that the signal intensity (the contrast of the interference fringes) of alignment system 50 is maximized. In this manner, in the present embodiment, the position and the attitude of wafer table 26 are controlled in almost real time, by using the surface position information of wafer W obtained immediately before the detection of grating mark GM by alignment system 50. Note that there is no inconvenience even if the light from grating mark GM subject to position measurement is not received and the surface position of wafer W is not detected, concurrently with the position measurement of grating mark GM.

Figure 9:
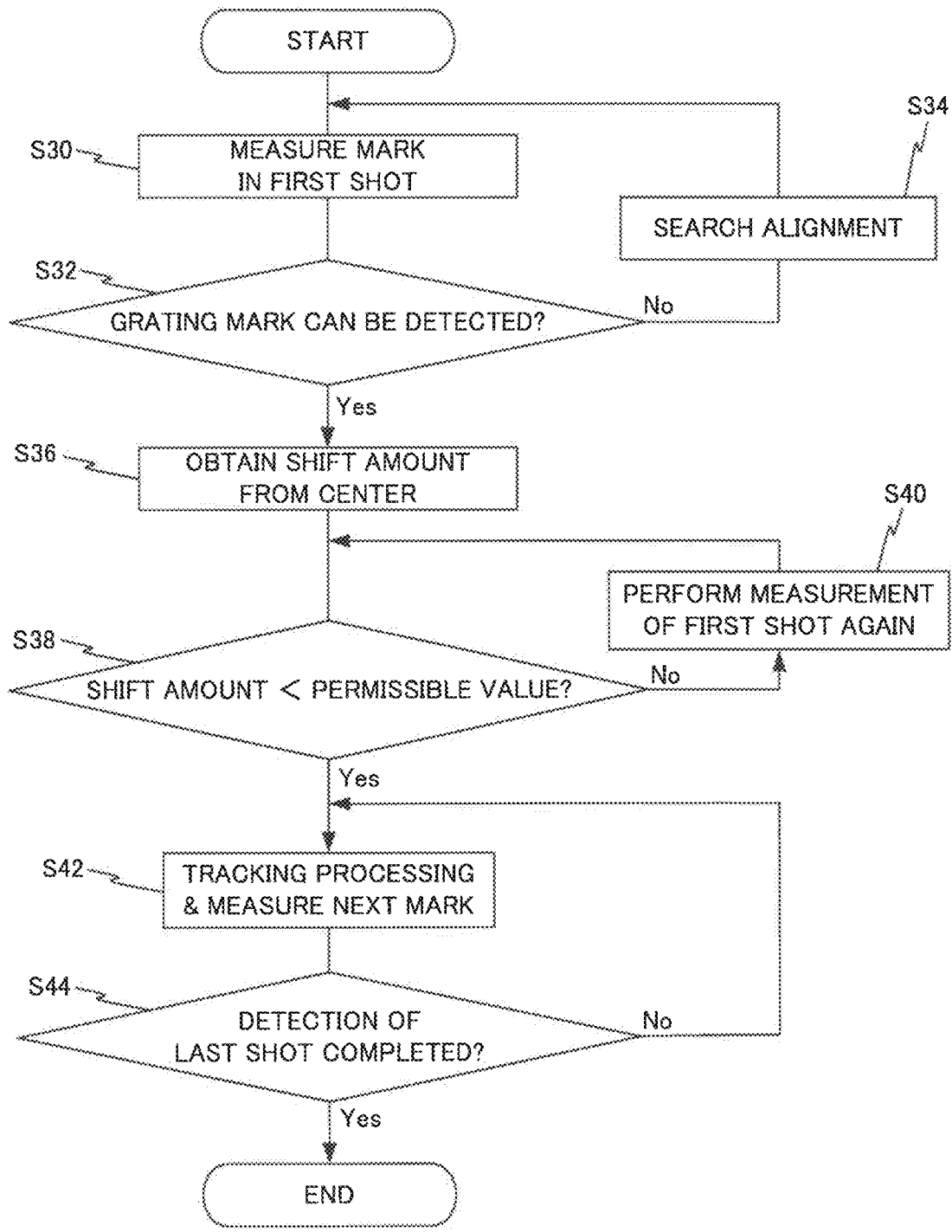
FIG. 9 is a flowchart used to explain an alignment measurement operation.

Next, an alignment operation performed in Step S14 will be described on the basis of a flowchart in FIG. 9.

In step S30, main controller 30 measures grating mark GM (see FIG. 2a) formed in the first shot area using alignment system 50 (see FIG. 1). Note that grating mark GM formed in the first shot area is also referred to as a "first mark". Here, in the case where wafer W is not correctly placed at a predetermined position in design on wafer stage 22 at the time of the wafer loading in Step S10 described above (including the case where a rotational shift exists), alignment system 50 cannot detect grating mark GM.

Thus, in the case where grating mark GM in the first shot area could not be detected (the "NO" judgment in Step S32), main controller 30 makes the procedure proceed to Step S34 and performs a search alignment operation of wafer W. The search alignment operation is performed using, for example, a cutout formed on the outer circumferential edge of wafer W, or a search mark formed on wafer W (none of the cutout and the search mark is illustrated), and main controller 30 controls the position (including the rotation in the θz direction) of wafer stage 22 on the basis of the result of the search alignment operation, and makes the procedure return to Step S30. In the case where grating mark GM in the first shot area could be detected, the procedure proceeds to Step S36.

Incidentally, in the case where grating mark GM in the first shot area on wafer W could not be detected in Step S32 described above, (the "NO" judgment in Step S32), such wafer W may be rejected. In this case, main controller 30 drives wafer stage 22 to a predetermined unloading position (which may share the same position as the loading position), and detaches wafer W from wafer stage 22 as well as making the procedure return to Step S10 and placing another wafer on the wafer stage 22.

Incidentally, the position of grating mark GM or the search mark described above in predetermined shot areas (e.g., arbitrary numbers of shot areas) on wafer W may be roughly (with a coarse precision compared with the alignment measurement in Step S14) measured beforehand (referred to as "prior measurement step"), for example, using alignment system 50. This prior processing allows the positional information of the wafer W loaded on wafer stage 22 to be grasped with better precision, and thus the situation can by suppressed in which grating mark GM in the first shot area on wafer W is not detected in Step S32 described above. Incidentally, grating mark GM or the search mark in this prior measurement step may also be included in the "first mark" described above.

In Step S36, main controller 30 obtains the absolute value of the position of grating mark GM using the foregoing method (see FIGS. 5a to 5c), on the basis of the output of alignment system 50. Main controller 30 obtains a shift amount between the center in the X-axis direction of the measurement beams irradiated from alignment system 50 and the center in the X-axis direction of grating mark GM, on the basis of the positional information of that grating mark GM and the positional information of alignment system 50 obtained in the calibration operation described above (see Step S12).

Here, although the "shift amount" between the center in the X-axis direction of the measurement beams and the center in the X-axis direction of grating mark GM is preferably obtained as a "shift amount" at the edge portion of grating mark GM in the −Y direction, it may be obtained at an arbitrary position of grating mark GM in the Y-axis direction. For example, the "shift amount" may be obtained as a "shift amount" near the center in the Y-axis direction of grating mark GM. Further, in the "shift amount" between the center in the X-axis direction of the measurement beams and the center in the X-axis direction of grating mark GM, the trajectory from the edge portion of grating mark GM in the +Y direction (i.e., the starting point where the measurement beam reaches grating mark GM) may be taken into account.

Subsequently, main controller 30 judges in Step S38 whether or not the result (the shift amount) obtained in Step S36 is greater than a predetermined permissible value. In this judgement, if the shift amount is equal to or greater than the permissible value (the "NO" judgement in Step S38), then the procedure proceeds to Step S40. On the contrary, if the shift amount is less than the permissible value (the "YES" judgment in Step S38), then the procedure proceeds to Step S42.

Figure 10:
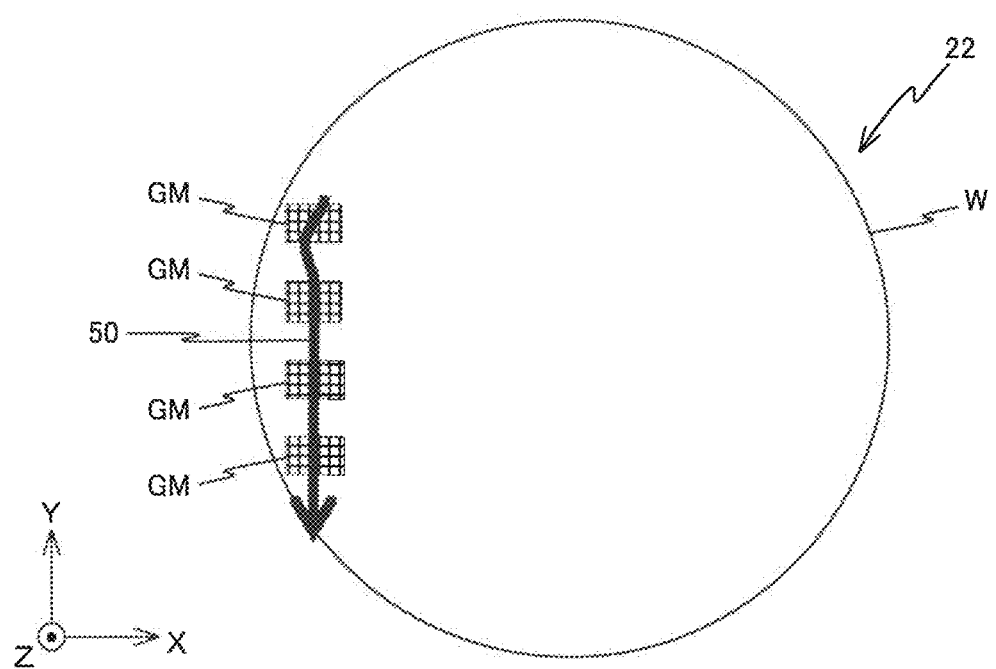
FIG. 10 is a view used to explain a relative positional relationship between a wafer stage and a measurement beam of the alignment system during the alignment measurement operation.

In Step S42, as illustrated in FIG. 10, main controller 30 relatively moves wafer stage 22 and the irradiation points on wafer W of the measurement beams irradiated from alignment system 50 in accordance with the shift amount obtained in Step S36 described above, thereby performing position measurement of grating mark GM that serves as the second detection subject while correcting the position of the irradiation points on grating mark GM of the measurement beams. Note that at least one of a plurality of grating marks GM, which server as the second and subsequent detection subjects, corresponds to a "second mark" in the present embodiment. Incidentally, although grating mark GM illustrated in FIG. 2a as described above is actually used as grating marks GM in FIG. 10, grating marks GM as illustrated in FIG. 10 that are orthogonal to the X-axis and the Y-axis may be used.

Since this control for correcting the X-position of wafer stage 22 is performed in order to make the measurement beams emitted from alignment system 50 coincide with the center of grating marks GM that serve as the second and subsequent detection subjects, the control is hereinafter referred to as tracking control. Here, grating mark GM serving as the second detection subject may be formed in the first shot area, or may be formed in another shot area. Further, main controller 30 may estimate the center positions of grating marks GM serving as the second and subsequent detection subjects in accordance with the shift amount obtained in Step S36 described above.

Note that, although it is depicted in FIG. 10 that the measurement beam is scanned with respect to wafer W in a meandering manner by being moved in the −X direction and the −Y direction and then in the +X direction and the −Y direction relative to wafer W, actually in the present embodiment, wafer stage 22 moves in the +Y direction while finely moving relative to the measurement beams (alignment system 50) in the +X direction or the −X direction. Incidentally, wafer stage 22 should move in the X-axis direction relative to the measurement beams (alignment system 50), and therefore, alignment system 50 may be configured movable in the X-axis direction, and the measurement beam may be finely driven in the +X direction or the −X direction relative to wafer W that is moved in the Y-axis direction, or both wafer W and the measurement beams (alignment system 50) may be finely driven in the +X direction or the −X direction as needed.

When the position measurement of grating marks GM formed in a plurality of shot areas included in the first row (the row on The utmost −X side) is completed by driving wafer stage 22 in the +Y direction, main controller 30, as shown by arrows in FIG. 8b, moves wafer stage 22 relative to alignment system 50 by a width of one shot area in the −X direction and also moves wafer stage 22 in the −Y direction (reverse the movement direction in the Y-axis direction), and thereby performs the position measurement of grating mark GM (see FIG. 2a) formed in each of a plurality of shot areas included in the second row. After that, the position measurement of all of grating marks GM subject to detection is performed, by appropriately switching the movement of wafer stage 22 in the −X direction and the movement in the +Y direction or the −Y direction. Incidentally, the number of movements in the X-axis direction and the Y-axis direction can be changed as needed, depending on the number and the placement of the shot areas set on the wafer.

Here, since the influence of vibration of the apparatus can be reduced by averaging the detection results (a so-called moving average), the longer period of time for detection of the grating marks is preferable. On the other hand, in the present embodiment, the detection of grating marks GM is performed while moving wafer W relative to alignment system 50 (to be more detailed, readout diffraction gratings Ga and Gb (see FIG. 4) that alignment system 50 has), which makes it difficult to secure the long period time for detection. Therefore, when performing the position measurement of a plurality of grating marks included in one row by driving wafer stage 22 in the Y-axis direction, main controller 30 controls the velocity of wafer stage 22 in the manner as described below.

Main controller 30 decreases the measurement velocity (the movement velocity of wafer stage 22 and the scanning velocity of the measurement beams) of grating mark GM in the first shot area (grating mark GM for obtaining the positional shift amount described above), compared with the measurement velocity of grating marks GM in the subsequent shot areas. For example, after the measurement of grating mark GM in the first shot area (corresponding to the first mark), main controller 30 performs the control of increasing the movement velocity of wafer stage 22. More specifically, after measuring grating mark GM in the first shot area while moving wafer stage 22 at the first velocity, main controller 30 gradually increases the measurement velocity of grating marks GM (corresponding to the second marks) subject to detection arrayed in order from the +Y side. Incidentally, after measuring grating mark GM (the first mark) in the first shot area while moving wafer stage 22 at the first velocity, the movement velocity of wafer stage 22 may be increased to the second velocity, and then the subsequent grating marks GM (the second marks) may be measured. With this operation, a long period of time for the detection of grating mark GM to obtain the shift amount described above can be secured, and thus the shift amount described above can be more accurately obtained, and at the same time the measurement period of time can be shortened because the distance in which wafer stage 22 moves can be shortened. Incidentally, not limited to the manner described above, the measurement velocity at the time when the position measurement of grating marks GM subject to detection included in the shot areas in the first row may be decreased, compared with the measurement velocity at the time when the position measurement of grating marks GM in the second and subsequent rows.

Further, at the time of position measurement of a plurality of grating marks arrayed in each row, the measurement velocity of the last grating mark GM to be measured last (or several grating marks GM including the last grating mark GM) may be decreased, compared with the measurement velocity of grating marks GM measured before the last grating mark or the several grating marks. In the present embodiment, as is described above, since the movement in the −Y direction of wafer stage 22 and the movement in the −Y direction of wafer stage 22 are switched at the time of position measurement of grating marks GM, it is necessary to decelerate wafer stage 22 in the Y-axis direction without fail at the time of the switching. Along with this deceleration, by decreasing the measurement velocity of the last grating mark GM to be measured last in each row, the measurement accuracy of the last grating marks GM can be improved, and at the same time the distance in which wafer sage 22 moves can be shortened, and thus the measurement period of time can be shortened.

Figure 7:
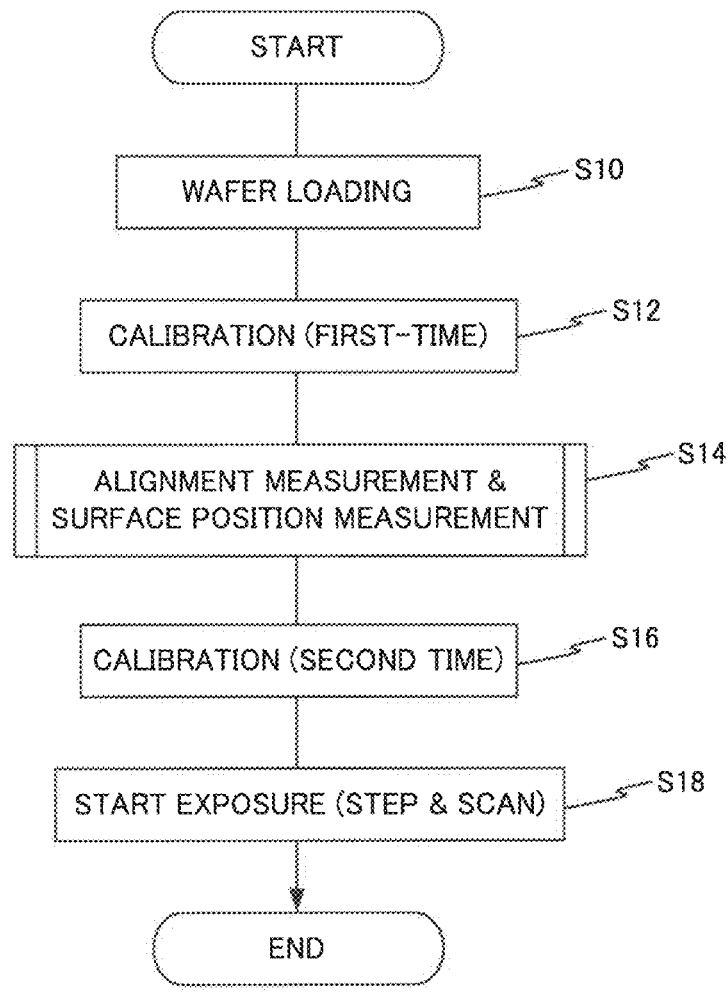
FIG. 7 is a flowchart used to explain an exposure operation using the exposure apparatus in FIG. 1.

When the position measurement of grating mark GM formed in the last shot area (in the case where the number of rows is the odd number, the shot area on the utmost −Y side, and in the case where the number of rows is the even number, the shot area on the utmost +Y side) included in the last row (the row on the utmost +X side in the present embodiment) is completed (the "YES" judgement in Step S44), main controller 30 makes the procedure proceed to Step S16 in FIG. 7 and performs the second-time calibration. In the second-time calibration, main controller 30 drives wafer stage 22 as needed, and positions the second measurement mark WFM2 directly under AF system 40 and alignment system 50, as illustrated in FIG. 8c. After that, main controller 30 performs the second-time calibration of multipoint focal position measurement system 40 and alignment system 50, using the second measurement mark WFM2.

Incidentally, in the description above, the shift amount is obtained using grating mark GM (i.e., one grating mark GM) in the first shot area in Step S36 (see FIG. 9), and on the basis of its result, the X-position of wafer stage 22 is corrected as needed (Step S42, and see FIG. 10). However, the correction of the X-position is not limited thereto, and the positions of grating marks GM in a plurality of shot areas including the first shot area (or a plurality of grating marks GM in the first shot area) may be measured, and on the basis of their results, the X-position of wafer stage 22 may be corrected. In this case, for example, it is preferable that a plurality of the grating marks are measured, and on the basis of their results, the movement trajectory of wafer stage 22 is obtained as the mathematical function (e.g., the linear function), by calculation.

Further, the position of the first shot area can be changed as needed, and it does not necessary have to be the shot area on the utmost −X side and the +Y side (the shot area in the vicinity of the first measurement mark WFM1), and for example, the grating mark in the shot area on the inner side of wafer W may be used. Further, the movement trajectory of wafer stage 22 may be obtained as the mathematical function (e.g., the linear function), for example, by calculation using a plurality of grating marks around grating mark GM in the first shot area (e.g., a plurality of grating marks included within a predetermined radius r).

Figure 11:
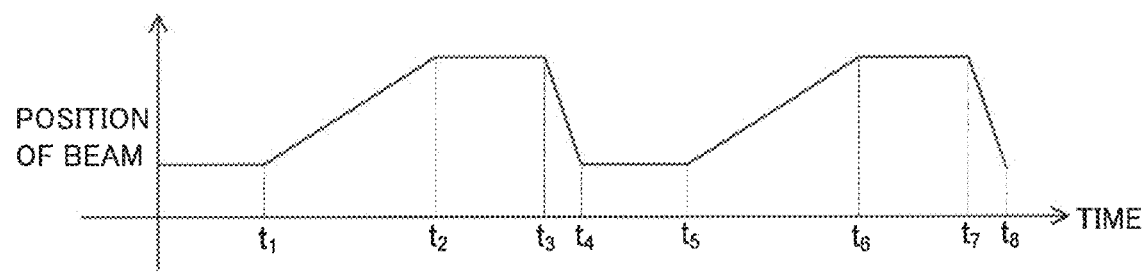
FIG. 11 is a view showing an example of a drive signal of a movable mirror equipped in the alignment system in FIG. 3.

Here, when performing the foregoing position measurement of grating marks GM on wafer W, main controller 30 causes movable mirror 74 of alignment system 50 to reciprocate a plurality of times (in accordance with the number of the marks subject to detection included in one row) in conjunction with the driving of wafer stage 22 in the +Y direction or the −Y direction. At this time, main controller 30 performs the control so that the driving waveform of movable mirror 74 has a saw-tooth shape, as illustrated in FIG. 11. Specifically, in FIG. 11, between the points $t_1$ and $t_2$ and between the points $t_5$ and $t_6$, movable mirror 74 is driven to scan the measurement beams, and between the points $t_3$ and $t_4$ and between the points $t_7$ and $t_8$, movable mirror 74 is driven to be returned to the initial position. In this manner, the velocity of movable mirror 74 at the time of returning movable mirror 74 is increased, compared with the velocity of movable mirror 74 at the time when causing the measurement beams to follow in the Y-axis direction in synchronization with grating marks GM. Accordingly, the case where the distance between grating marks GM subject to detection is small can also be coped with.

When the second-time calibration is completed, main controller 30 makes the procedure proceed to Step S18, and obtains distribution information of the surface position of each shot area on the basis of the output of AF system 40 acquired in Step S14, and also obtains the array coordinate of each shot area on the basis of the measurement results of alignment system 50 by calculation, for example, by the method such as Enhanced Global Alignment (EGA) and the like. Main controller 30 performs an exposure operation of a step-and-scan method with respect to each shot area, while driving wafer stage 22 according to the surface position information described above and the results of the EGA calculation. Since this exposure operation of a step-and-scan method is similar to those conventionally performed, the detailed description thereof will be omitted.

According to exposure apparatus 10 related to the present first embodiment discussed so far, the position of wafer stage 22 is corrected in accordance with the shift in the irradiation positions of the measurement beams of alignment system 50 with respect to the first grating mark GM, when the measurement of the subsequent grating marks GM is performed, and therefore the positional information of grating marks GM subject to detection can be reliably obtained.

Further, alignment system 50 related to the present embodiment scans measurement beams L1 and L2 with respect to grating mark GM (see FIG. 3 for each of them) in the Y-axis direction while moving wafer W (wafer stage 22) in the Y-axis direction, and therefore, a position measurement operation of the grating mark GM can be performed concurrently with, for example, a movement operation of wafer stage 22 toward an exposure starting position, which is performed after wafer W is loaded onto wafer stage 22. In this case, it is preferable to dispose alignment system 50 beforehand on the movement course of wafer stage 22. With this disposition in advance, the alignment measurement time can be shortened and the overall throughput can be improved.

Further, alignment system 50 related to the present embodiment scans the measurement beam so as to follow wafer W (grating mark GM) that is moved in the scanning direction, which allows the measurement for a long period of time to be performed. Therefore, since the so-called moving average of the output can be taken, the influence of the vibration of the apparatus can be reduced. Further, if a mark in a line-and-space shape is detected using an image sensor (such as a CCD) as a beam receiving system of the alignment system, the other images than the images of lines completely parallel to the scanning direction cannot be detected (such images are distorted), when the measurement beam is scanned to follow wafer W that is moved in the scanning direction. In contrast, in the present embodiment, since the position measurement of grating mark GM is performed by causing the diffraction beams from the grating mark GM to interfere with each other, the mark detection can be reliably performed.

Further, alignment system 50 related to the present embodiment has, for example, three photodetectors PD1 to PD3 (for blue light, green light and red light, respectively) as detector 84, corresponding to measurement beams L1 and L2 that are white light. Therefore, for example, by detecting overlay marks (not illustrated) formed on wafer W using the white light, and obtaining the color of light with which the contrast of the interference fringes is the highest beforehand prior to wafer alignment, and which output of the three photodetectors PD1 to PD3 exemplified above is optimal to be used in the wafer alignment can be determined.

[Second Embodiment]

Next, an exposure apparatus related to a second embodiment will be discussed. Since the exposure apparatus related to the present second embodiment is different only in the position of measurement mark(s) on the wafer stage, from exposure apparatus 10 related to the first embodiment described previously, only the difference will be described below, and with regard to components that have the same configurations and functions as those in the first embodiment, the same reference signs as those in the first embodiment will be used and the description thereof will be omitted.

In the first embodiment described previously, as illustrated in the drawings such as FIG. 8a, for example, two measurement marks WFM1 and WFM2 are disposed on wafer stage 22, while on a wafer stage 122 related to the present second embodiment, as illustrated in FIGS. 12a to 12d, one measurement mark is disposed on the +Y side of a wafer holder (not illustrated) (which overlaps with wafer W in FIGS. 12a to 12d). An exposure operation in the present second embodiment will be described below using a flowchart illustrated in FIG. 13.

Figure 12A:
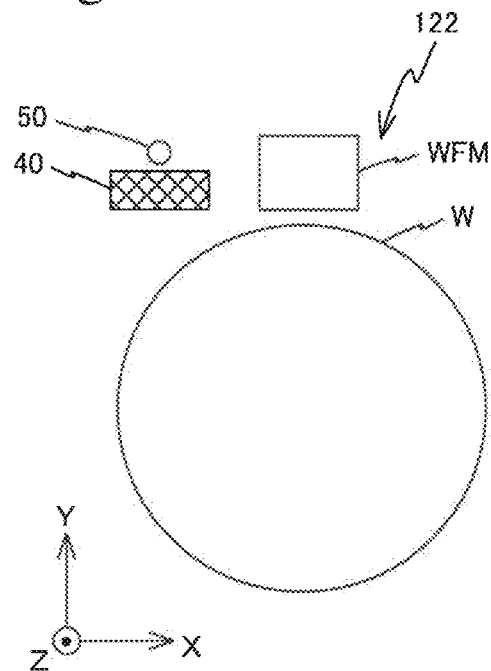
FIGS. 12a to 12d are views (No. 1 to No. 4) used to explain an alignment measurement operation in an exposure apparatus related to a second embodiment.
Figure 12B:
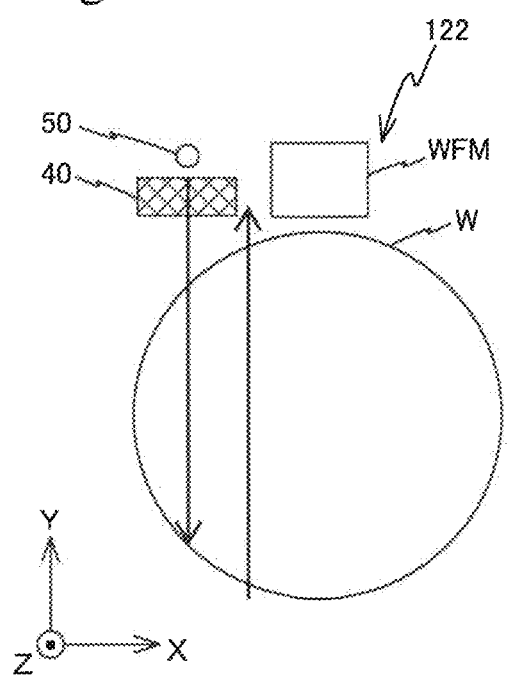
Figure 12C:
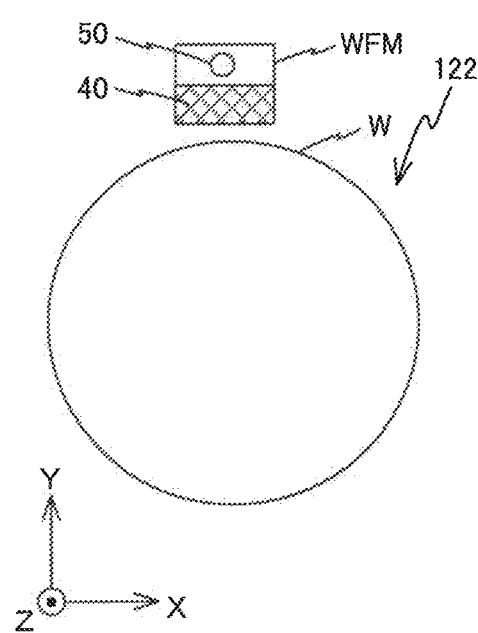
Figure 12D:
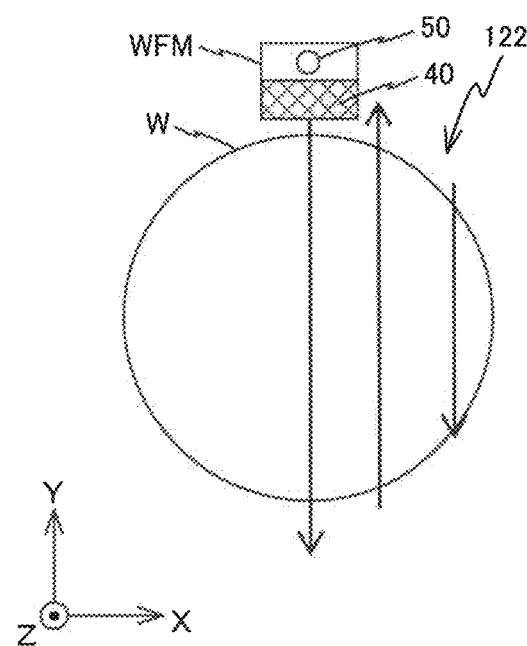
Figure 13:
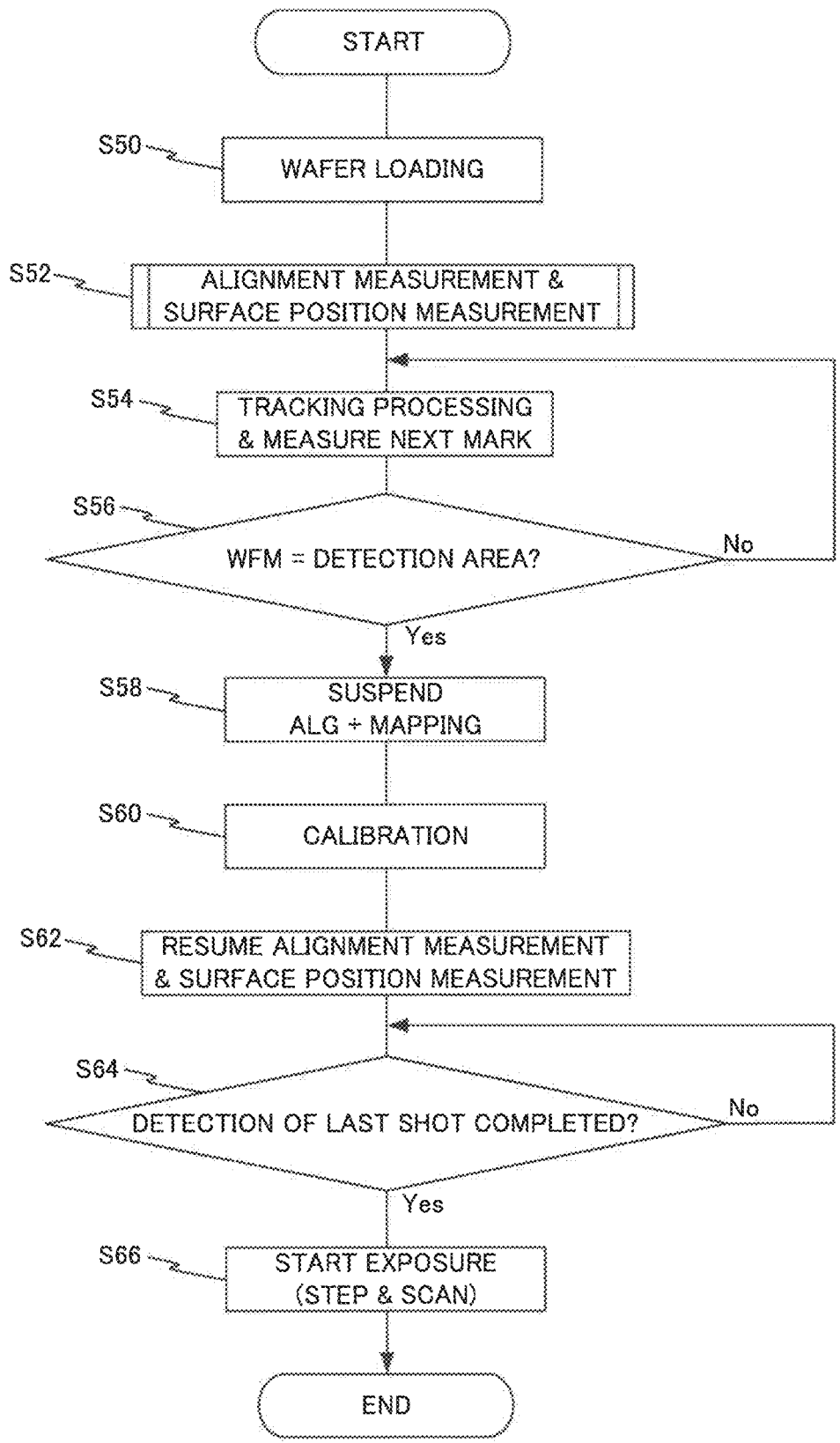
FIG. 13 is a flowchart used to explain an exposure operation in the second embodiment.

Main controller 30 loads wafer W onto wafer stage 122 in Step S50 (see FIG. 12a). In the first embodiment described above, a calibration operation is performed immediately after the loading of wafer W, while in the present second embodiment, the procedure proceeds to Step S52 after the loading of wafer W, and then wafer stage 22 is driven in the XY-plane as needed and the position measurement of all grating marks GM subject to detection is performed.

Figure 14:
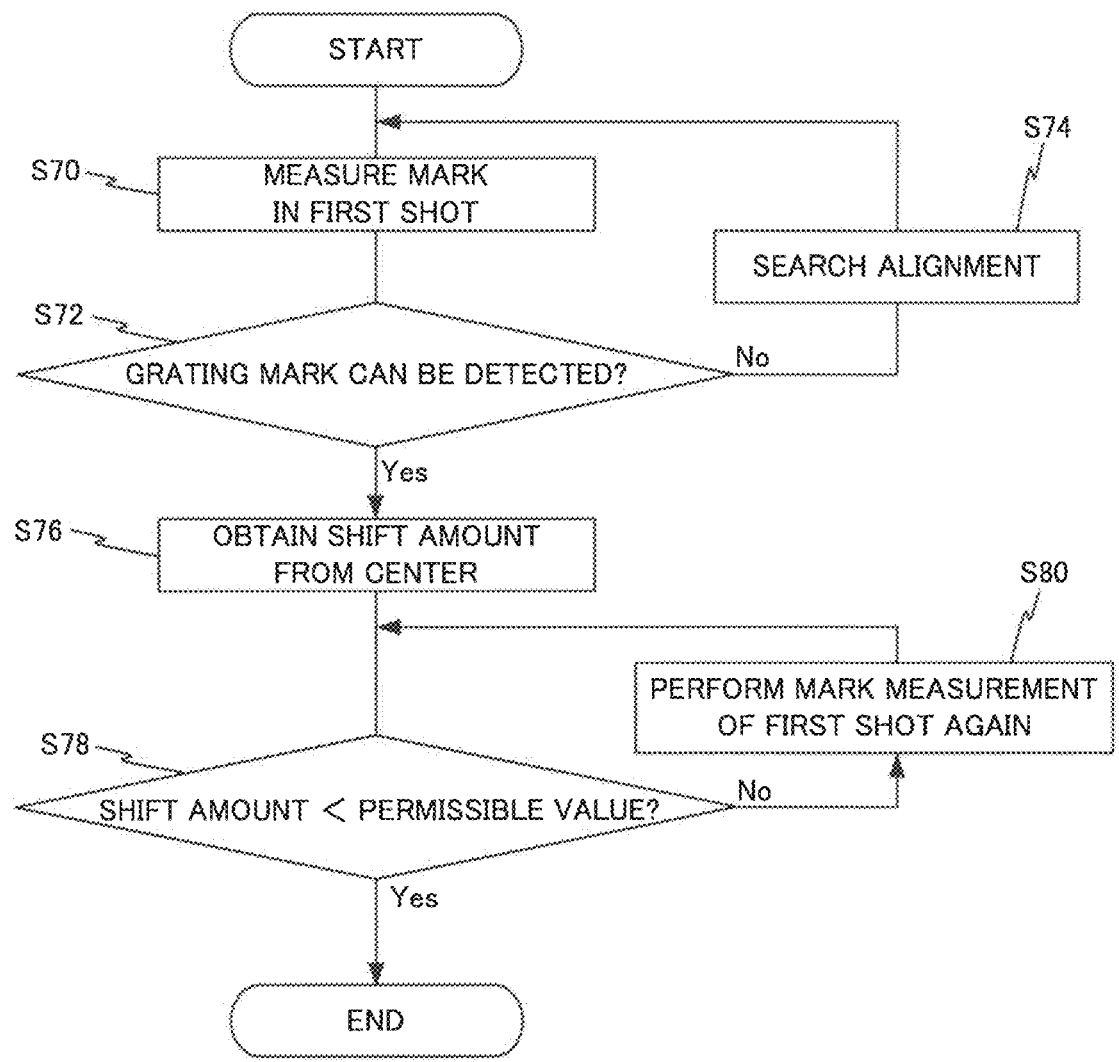
FIG. 14 is a flowchart used to explain an alignment measurement operation in the second embodiment.

Also in a position measurement operation of grating mark GM in the present second embodiment, tracking processing similar to that in the first embodiment is performed. That is, as illustrated in a flowchart in FIG. 14 that shows a specific example of Step S52 in FIG. 13, the position measurement of grating mark GM in the first shot (corresponding to the first mark) is performed in Step S70, and as a result of the position measurement, in the case where the detection of grating mark GM could not be performed (the "NO" judgement in Step S72), the procedure proceeds to Step S74 and a search alignment operation is performed, and then the procedure returns to Step S70, in which the position measurement of grating mark GM in the first shot is performed over again. On the other hand, in the case where the position measurement of grating mark GM could be performed (the "YES" judgement in Step S72), the procedure proceeds to Step S76 and a positional shift amount of the measurement beams on grating mark GM is obtained. Further, in the case where the positional shift amount obtained in Step S76 is less than a permissible value (the "YES" judgment in Step S78), the procedure proceeds to Step S54 in FIG. 13. On the other hand, in the case where the positional shift amount is equal to or greater than the permissible value (the "NO" judgment in Step S78), the procedure proceeds to Step S80, the position measurement of grating mark GM in the first shot is performed over again.

Referring back to FIG. 13, in Step S54, similarly to the first embodiment, the measurement beam and wafer W are relatively moved in the X-axis direction (a direction of cancelling oat the positional shift described above) and also wafer W is driven in the Y-axis direction, as illustrated in FIG. 10. Alignment system 50 (see FIG. 3) performs the position measurement of grating marks GM subject to detection while irradiating the measurement beam onto wafer W so as to follow the movement of wafer W in the Y-axis direction. Further, the surface position measurement (a focus mapping operation) of wafer W using AF system 40 is also performed concurrently.

In the next step, Step 56, concurrently with the position measurement operation of grating marks GM described above, main controller 30 judges whether or not the detection area of alignment system 50 and a measurement mark WFM coincide with each other in position within the XY plane on the basis of the output of wafer stage position measurement system 38. As a result of this judgement, when the detection area of alignment system 50 and measurement mark WFM coincide with each other in position within the XY plane, the procedure proceeds to Step S58, and the position measurement operation of grating marks GM and the focus mapping operation are suspended, and then in the next step, Step S60, the calibration operation of AF system 40 and alignment system 50 is performed.

Then, when the calibration operation is completed, the procedure proceeds to Step S62, and main controller 30 resumes the position measurement operation of grating marks GM and the focus mapping operation. Then, when the position measurement of grating mark GM in the last shot is completed (the "YES" judgment in Step S64), an exposure operation of a step-and-scan method is started in Step S66. Also in the present second embodiment discussed so far, the effect similar to that of the first embodiment described above can be obtained.

Incidentally, the control method of wafer stage 22 including the tracking control related to the first embodiment and the second embodiment described above can be changed as needed. For example, in the first embodiment and the second embodiment described above, in the case where grating mark M in the first shot area cannot be detected (the "NO" judgement in Step S32 or S72), the search alignment is performed. However, the timing of the search alignment is not limited thereto, and the search alignment may be executed without fail after the wafer loading (any period between Step S10 and Step S14, or any period between Step S50 and Step S54). Further, in the first embodiment and the second embodiment described above, the foregoing prior measurement step may he executed without fail.

Figure 2B:
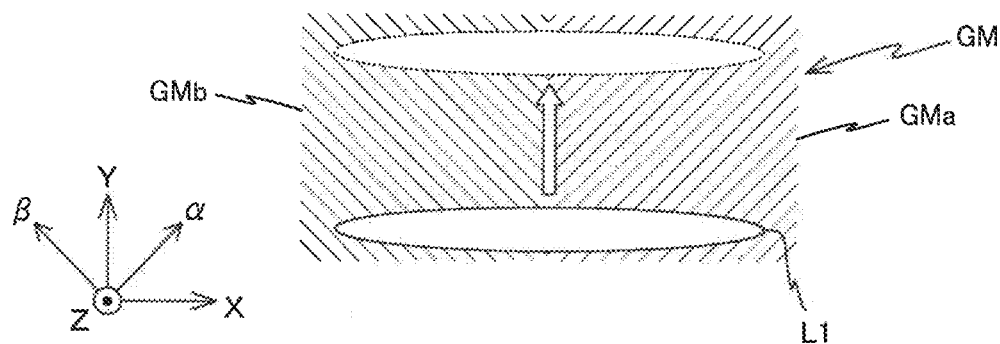

Further, in the first embodiment and the second embodiment described above, as illustrated in FIG. 2a, grating marks GMa and GMb are irradiated with measurement beams L1 and L2 that correspond to grating marks GMa and GMb, respectively. However, the measurement beams are not limited thereto, and as illustrated in FIG. 2b, a single measurement beam L1 elongated (wide) in the X-axis direction may be irradiated on grating marks GMa and GMb.

Figure 2C:
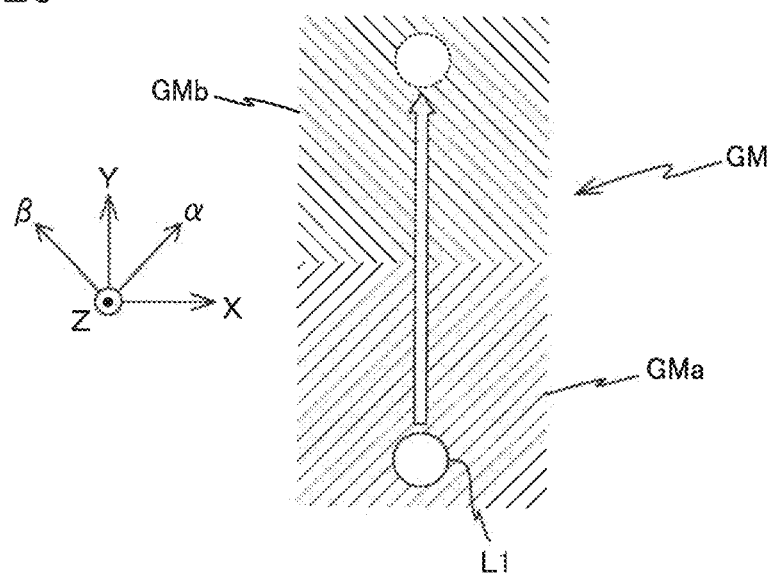

Further, in the first embodiment and the second embodiment described above, as illustrated in FIG. 2a, grating marks GMa and GMb are arrayed along the X-axis direction. However, the arrayed direction is not limited thereto, and as illustrated in FIG. 2c, grating marks GMa and GMb may be arrayed along the Y-axis direction. In this case, the position in the X-Y plane of grating mark GM can be obtained by scanning a single measurement beam L1 in the order of grating marks GMa and GMb (or the reversed order).

Figure 15A:
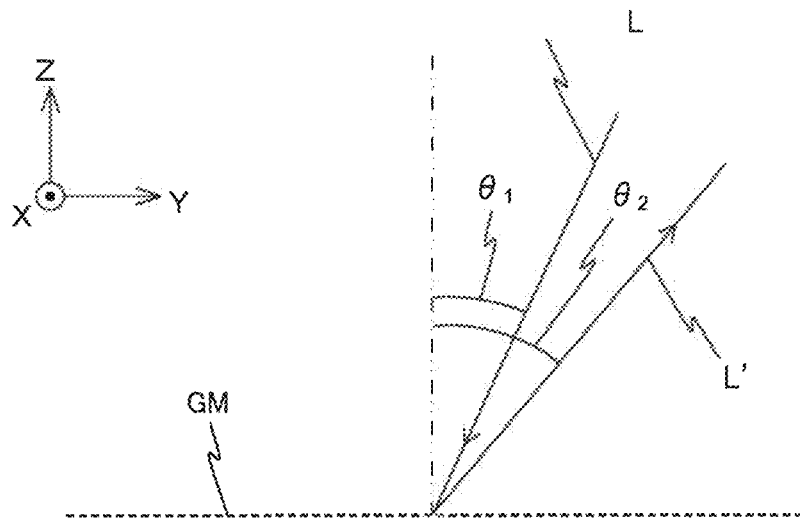
FIG. 15a is a view showing a measurement beam from an alignment system that is incident on a grating mark and a diffraction beam related to a modified example.

Further, in the first embodiment and the second embodiment described above, a configuration is employed in which measurement beams L1 and L2 emitted from alignment system 50 are perpendicularly incident on grating mark GM. However, the incidence method is not limited thereto, and measurement beams L1 and L2 may be incident on grating mark GM at a predetermined angle (i.e., obliquely) with respect to grating mark GM. For example, as illustrated in FIG. 15a, in the case where a measurement beam L with a wavelength λ is made to be incident on grating mark GM with a grating pitch p at an incident angle $\theta_1$ with respect to the grating mark GM, a diffraction beam L' of a diffraction angle $\theta_2$ is generated from grating mark GM. Here, the formula $\lambda/p=\sin(\theta_1)+\sin(\theta_2)$ is established, and therefore, by employing the oblique incidence method as illustrated in FIG. 15a, even if an optical system having the same numerical aperture NA is used, the position measurement of grating mark GM with a finer pitch can be performed, compared with the case where measurement beam L is made to be incident perpendicularly on grating mark GM.

Figure 15B:
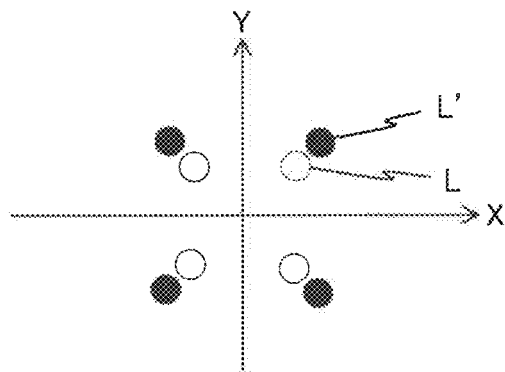
FIG. 15b and FIG. 15c are views (No. 1 and No. 2) showing the positions of the measurement beams and the diffraction beams on a pupil plane of an objective lens.
Figure 15B:
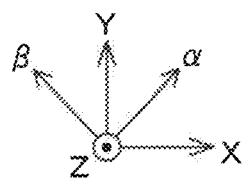
Figure 15C:
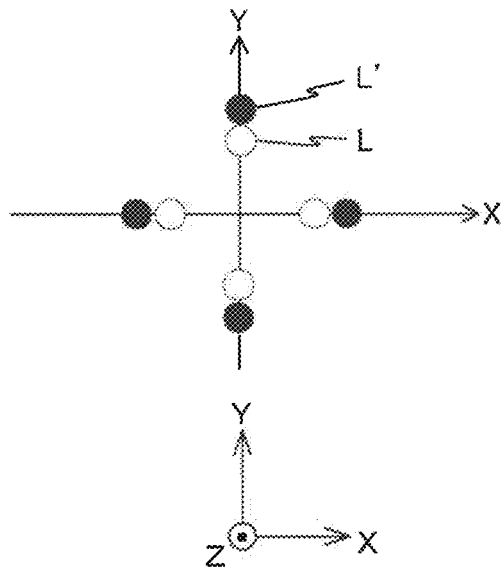

Here, in the first embodiment and the second embodiment described above, the position measurement of grating mark GM is performed by causing a pair of diffraction beams from grating mark GM to interfere with each other, and therefore, measurement beam L is irradiated on grating mark GM from four directions in total in order to perform the position measurement of grating mark GM (see FIG. 15a) in the orthogonal two axis directions as illustrated in FIG. 15b, even in the case where the oblique incidence method as illustrated in FIG. 15a is used. Here, FIG. 15b is a view showing images (directions of beams) on a pupil plane of objective lens 62. As is described above, since grating mark GM in the present embodiment (see FIG. 2a) has a period direction in the α direction or the β direction that are at, for example, a 45 degree angle with respect to the X-axis and the Y-axis, the incidence direction of measurement beam L and the emitting direction of diffraction beam L' are also in the α direction or the β direction similarly. Incidentally, the period direction of the grating mark subject to measurement may be a direction parallel to the X-axis and the Y-axis, and in this case, as illustrated in FIG. 15c, measurement beam L is made to be incident in the direction parallel to the X-axis and the Y-axis. In this case, diffraction beam L' is emitted in the direction parallel to the X-axis and the Y-axis.

Figure 16:
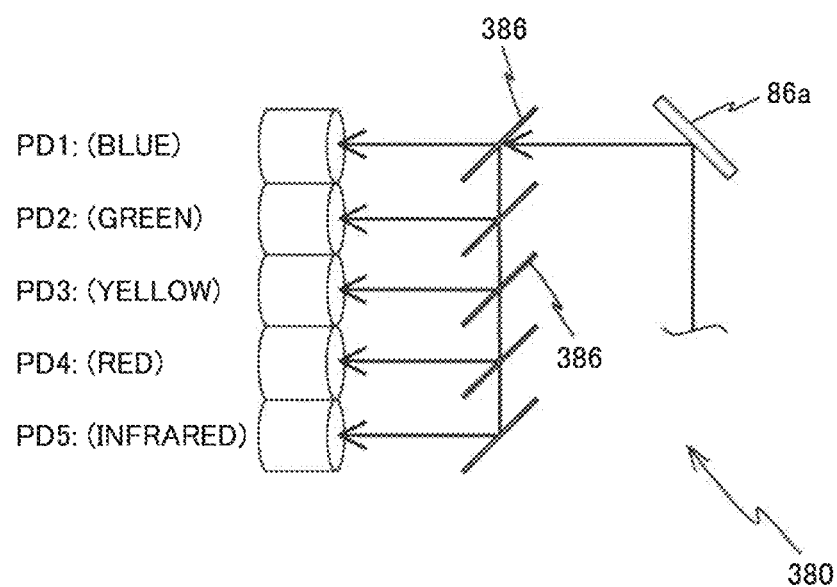
FIG. 16 is a view showing a modified example of a detection system of an alignment system.

Further, beam receiving system 80 of alignment system 50 in the first embodiment described above spectrally splits white light with spectral prism 86b. However, the spectral means is not limited thereto, and like a detection system 380 as illustrated in FIG. 16, white light may be spectrally split toward photodetectors PD1 to PD5 disposed corresponding to the respective colors of light (e.g., blue light, green light, yellow light, red light and infrared light) by using a plurality of spectral filters 386.

Further, illumination light IL is not limited to the ArF excimer laser beam (with a wavelength of 193 nm), but may be ultraviolet light such as a KrF excimer laser beam (with a wavelength of 248 nm), or a vacuum ultraviolet light such as an $F_2$ laser beam ((with a wavelength of 157 nm). For example, as is disclosed in U.S. Pat. No. 7,023,610, a harmonic wave, which is obtained by amplifying a single-wavelength laser beam in the infrared or visible range emitted by a DFB semiconductor laser or a fiber laser as vacuum ultraviolet light, with a fiber amplifier doped with, for example, erbium (or both erbium and ytterbium), and by converting the wavelength into ultraviolet light using a nonlinear optical crystal, may also be used. Further, the wavelength of illumination light IL is not limited to the light having a wavelength equal to or more than 100 nm, and the light having a wavelength less than 100 nm may be used, and for example, the embodiments described above can also be applied to an EUV (Extreme Ultraviolet) exposure apparatus that uses an EUV in a soft X-ray range (e.g., a wavelength range from 5 to 15 nm). In addition, the embodiments described above can also be applied to an exposure apparatus that uses charged particle beams such as an electron beam or an ion beam.

Further, the projection optical system in the exposure apparatus of each of the embodiments described above is not limited to a reduction system but may be either of an equal magnifying system. or a magnifying system, and projection optical system 16b is not limited to a dioptric system but may be either of a catoptric system or a catadioptric system, and its projected image may be either of an inverted image or an erected image. Further, the configurations described in detail in the first embodiment and the second embodiment described above, respectively, may be arbitrarily combined to be implemented.

Further, in each of the embodiments described above, a light-transmission type mask (reticle), which is a light-transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micro-mirror Device) that is a type of a non-emission type image display device (spatial light modulator) or the like) on which a light-transmitting pattern, a reflection pattern, or an emission pattern is formed on the basis of electronic data of the pattern that is to be exposed may also be used.

Further, each of the embodiments described above can also be applied to an exposure apparatus that performs an exposure operation in a state in which a space between a projection optical system and an object to be exposed (e.g., a wafer) is filled with a liquid (e.g., pure water), which is a so-called liquid immersion exposure apparatus, as is disclosed in, for example, U.S. Pat. No. 8,004,650.

Further, each of the embodiments described above can also be applied to an exposure apparatus that is equipped with two wafer stages, as is disclosed in, for example, U.S. Patent Application Publication No. 2010/0066992.

Further, each of the embodiments described above can also be applied to an exposure apparatus (lithography system) that forms line-and-space patterns on wafer W by forming interference fringes on wafer W, as is disclosed in, for example, PCT International Publication No. 01/35168. Further, each of the embodiments described above can also be applied to a reduction projection exposure apparatus of a step-and-stitch method that synthesizes a shot area and a shot area.

Further, each of the embodiments described above can also be applied to an exposure apparatus that synthesizes two reticle patterns on a wafer via a projection optical system and almost simultaneously performs double exposure of one shot area on the wafer by one-time scanning exposure, as is disclosed in, for example, U.S. Pat. No. 6,611,316.

Further, an object on which a pattern is to be formed (an object to be exposed to which an energy beam is irradiated) in each of the embodiments described above is not limited to a wafer, but may be other objects such as a glass plate, a ceramic substrate, a film member, or a mask blank.

Further, the use of the exposure apparatus is not limited to the exposure apparatus used for manufacturing semiconductor devices, and can be widely applied also to, for example, an exposure apparatus for manufacturing liquid crystal display devices which transfers a liquid crustal display device pattern onto a square-shaped glass plate, and to an exposure apparatus for manufacturing organic EL, thin-film magnetic heads, imaging devices (such as CCDs), micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a reticle or a mask used in an exposure apparatus such as an optical exposure apparatus, an EUV exposure apparatus, an X-ray exposure apparatus, or an electron beam exposure apparatus.

Electronic devices such as semiconductor devices are manufactured through the steps such as: a step in which the function/performance design of a device is performed; a step in which a reticle based on the design step is manufactured; a step in which a wafer is manufactured using a silicon material; a lithography step in which a pattern of a mask (the reticle) is transferred onto the wafer with the exposure apparatus (a pattern forming apparatus) of the embodiments described previously and the exposure method thereof; a development step in which the wafer that has been exposed is developed; an etching step in which an exposed member of the other section than a section where resist remains is removed by etching; a resist removal step in which the resist that is no longer necessary when etching is completed is removed; a device assembly step (including a dicing process, a bonding process, and a packaging process); and an inspection step. In this case, in the lithography step, the exposure method described previously is implemented using the exposure apparatus of the embodiments described above and a device pattern is formed on the wafer, and therefore, the devices with a high integration degree can be manufactured with high productivity.

Incidentally, the disclosures of all the publications, the PCT International Publications, the U.S. Patent Application Publications and the U.S. Patents are related to exposure apparatuses and the like that are cited in the description so far are each incorporated herein by reference.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus, comprising:
    a movable body which is movable within a two-dimensional plane including a first axis and a second axis intersecting the first axis, and on which an object is placed;
    a mark detection system that is capable of scanning a measurement beam in a direction of the first axis, with respect to a mark of the object placed on the movable body, and capable of receiving a beam from the mark; and
    a control system that performs detection of the mark of the object using the mark detection system, wherein the control system:
    scans the measurement beam in the direction of the first axis from the mark detection system with respect to the mark of the object while moving the movable body in the direction of the first axis;
    detects the mark and measures a positional relationship between the mark and the measurement beam, based on a result of receiving the beam from the mark by the mark detection system, and
    performs adjustment of a relative position between the movable body and the measurement beam based on the positional relationship that has been measured.

2. The movable body apparatus according to claim 1, wherein
    the object has the mark serving as a first mark, and a second mark different from the first mark, and
    the control system performs the adjustment of the relative position, and detects the second mark while moving the movable body in the direction of the first axis.

3. The movable body apparatus according to claim 2, wherein the second mark is a mark that is detected after detection of the first mark.

4. The movable body apparatus according to claim 2, wherein
the first mark includes two or more marks, and
the control system obtains a positional shift amount for each of the two or more marks, and performs the adjustment of the relative position between the movable body and the measurement beam based on the positional shift amount.

5. The movable body apparatus according to claim 3, wherein
the first mark includes two or more marks, and
the control system obtains a positional shift amount for each of the two or more marks, and performs the adjustment of the relative position between the movable body and the measurement beam based on the positional shift amount.

6. The movable body apparatus according to claim 1, wherein
the adjustment of the relative position includes adjustment of the relative position in a direction of the second axis.

7. The movable body apparatus according to claim 4, wherein
the adjustment of the relative position includes adjustment of the relative position in a direction of the second axis.

8. The movable body apparatus according to claim 5, wherein
the adjustment of the relative position includes adjustment of the relative position in a direction of the second axis.

9. The movable body apparatus according to claim 1, further comprising:
a position measurement system capable of measuring position information of the movable body within the two-dimensional plane, wherein
the control system detects position information of the mark using the position measurement system and the mark detection system.

10. The movable body apparatus according to claim 1, wherein
the mark detection system is capable of detecting the measurement beam irradiated on the mark, and
the control system obtains the positional relationship between the mark and the measurement beam based on a result of detecting the measurement beam.

11. An exposure apparatus, comprising:
the movable body apparatus according to claim 1, in which an object provided with a mark is placed on the movable body, wherein
the object placed on the movable body is exposed by being irradiated with an energy beam.

* * * * *